United States Patent

Luneburg et al.

(10) Patent No.: US 9,489,769 B2
(45) Date of Patent: Nov. 8, 2016

(54) DYNAMICALLY UPDATING COMPARTMENTS REPRESENTING ONE OR MORE GEOLOGICAL STRUCTURES

(71) Applicant: Landmark Graphics Corporation, Houston, TX (US)

(72) Inventors: Catalina Maria Luneburg, Golden, CO (US); Michael David Ewing, Castle Rock, CO (US); Sammi Igarashi, Lakewood, CO (US)

(73) Assignee: Landmark Graphics Corporation, Houston, TX (US)

( * ) Notice: Subject to any disclaimer, the term of this patent is extended or adjusted under 35 U.S.C. 154(b) by 0 days.

(21) Appl. No.: 14/431,757

(22) PCT Filed: Aug. 15, 2014

(86) PCT No.: PCT/US2014/051306
§ 371 (c)(1),
(2) Date: Mar. 26, 2015

(87) PCT Pub. No.: WO2015/023960
PCT Pub. Date: Feb. 19, 2015

(65) Prior Publication Data
US 2015/0241597 A1    Aug. 27, 2015

Related U.S. Application Data

(60) Provisional application No. 61/866,927, filed on Aug. 16, 2013.

(51) Int. Cl.
*G06G 7/48* (2006.01)
*G06T 17/05* (2011.01)
(Continued)

(52) U.S. Cl.
CPC ............. *G06T 17/05* (2013.01); *G01V 99/005* (2013.01); *G06T 17/10* (2013.01); *G06T 2210/56* (2013.01); *G06T 2219/2008* (2013.01)

(58) Field of Classification Search
CPC .................. G06T 17/05; G06T 17/10; G06T 2219/2008; G06T 2210/56; G01V 99/005
USPC ......................................................... 703/10
See application file for complete search history.

(56) References Cited

U.S. PATENT DOCUMENTS

| 6,128,577 A | 10/2000 | Assa et al. |
| 8,275,589 B2 | 9/2012 | Montaron et al. |
| 2007/0016389 A1 | 1/2007 | Ozgen |

FOREIGN PATENT DOCUMENTS

| KR | 1020110138088 A | 12/2011 |
| WO | 2009094064 A1 | 7/2009 |

(Continued)

OTHER PUBLICATIONS

Commissioner; International Search Report and the Written Opinion of the International Searching Authority; PCT/US14/51306; Nov. 24, 2014; 9 pgs.; ISA/KR.

(Continued)

*Primary Examiner* — Saif Alhija
(74) *Attorney, Agent, or Firm* — Crain, Caton & James; Tenley Krueger

(57) ABSTRACT

Systems and methods for dynamically updating compartments representing one or more geological structures by performing one or more dynamic interactions on i) current data; ii) a predefined polygon area-of-interest and/or predefined minimum/maximum depths from volume-of-interest based model sealing; and/or iii) a fluid contact flag and/or a sealing state from a fluid fill analysis.

20 Claims, 27 Drawing Sheets

(51) Int. Cl.
*G06T 17/10* (2006.01)
*G01V 99/00* (2009.01)

(56) References Cited

FOREIGN PATENT DOCUMENTS

| WO | 2011059535 A1 | 5/2011 |
| WO | 2012102784 A1 | 8/2012 |

OTHER PUBLICATIONS

CSet Tree; DecisionSpace Online Help; Sep. 14, 2011; 4 pgs; 5000.8.0.0; Landmark Graphics/Halliburton USA.

Display Properties—Compartments; DecisionSpace Online Help; May 30, 2012; 5 pgs; 5000.8.1.1; Landmark Graphics/ Halliburton USA.

CSet Tree; DecisionSpace Online Help; Nov. 9, 2012; 5 pgs; 5000.8.2.0; Landmark Graphics/Halliburton USA.

Simin Bahariou; International Preliminary Report on Patentability; PCT/US14/51306; Feb. 25, 2016; 6 pgs.; The International Bureau of WIPO.

Lili Eng; Patent Examination Report No. 1 for Australian Patent Application No. 2014306489; Feb. 24, 2016; 6 pgs.; Australia Patent Office.

Souche, L., et al.; Volume Based Modeling—Automated Construction of Complex Structural Models; 75th EAGE Conference & Exhibition incorporating SPE EUROPEC 2013, London, UK; Jun. 10-13, 2013; 5 pgs.

DYNAMICALLY UPDATING COMPARTMENTS REPRESENTING ONE OR MORE GEOLOGICAL STRUCTURES

CROSS-REFERENCE TO RELATED APPLICATIONS

This Application claims priority from PCT Patent Application Serial No. PCT/US14/51306, filed on Aug. 15, 2014, which claims priority from U.S. Provisional Patent Application Ser. No. 61/866,927, filed on Aug. 16, 2013, which are incorporated herein by reference.

STATEMENT REGARDING FEDERALLY SPONSORED RESEARCH

Not applicable.

FIELD OF THE DISCLOSURE

The present disclosure generally relates to systems and methods for dynamically updating compartments representing one or more geological structures. More particularly, the present disclosure relates to dynamically updating compartments representing one or more geological structures by performing one or more dynamic interactions on i) current data; ii) a predefined polygon area-of-interest and/or predefined minimum/maximum depths from volume-of-interest based model sealing; and/or iii) a fluid contact flag and/or a sealing state from a fluid fill analysis.

BACKGROUND

Compartments are on-the-fly auto-detected sealed spaces in the framework bound by framework objects (surfaces, faults, geoshells, fluid contacts) and/or the framework limits. Compartments provide visual control for highly accurate volumetric calculations; they provide thickness grids and visualize complex geologic structures. Conventional compartments technology started modeling sealed spaces (volume-based modeling), but does not provide the level of functionality and updatability such as the geologic grouping of compartments and associated tools. In addition, the framework to geocellular model workflow is very linear and static and most capabilities are inherent to the geocellular models and not to the framework.

BRIEF DESCRIPTION OF THE DRAWINGS

The present disclosure is described below with references to the accompanying drawings in which like elements are referenced with like reference numerals, and in which.

DETAILED DESCRIPTION OF THE PREFERRED EMBODIMENTS

Figure 1:
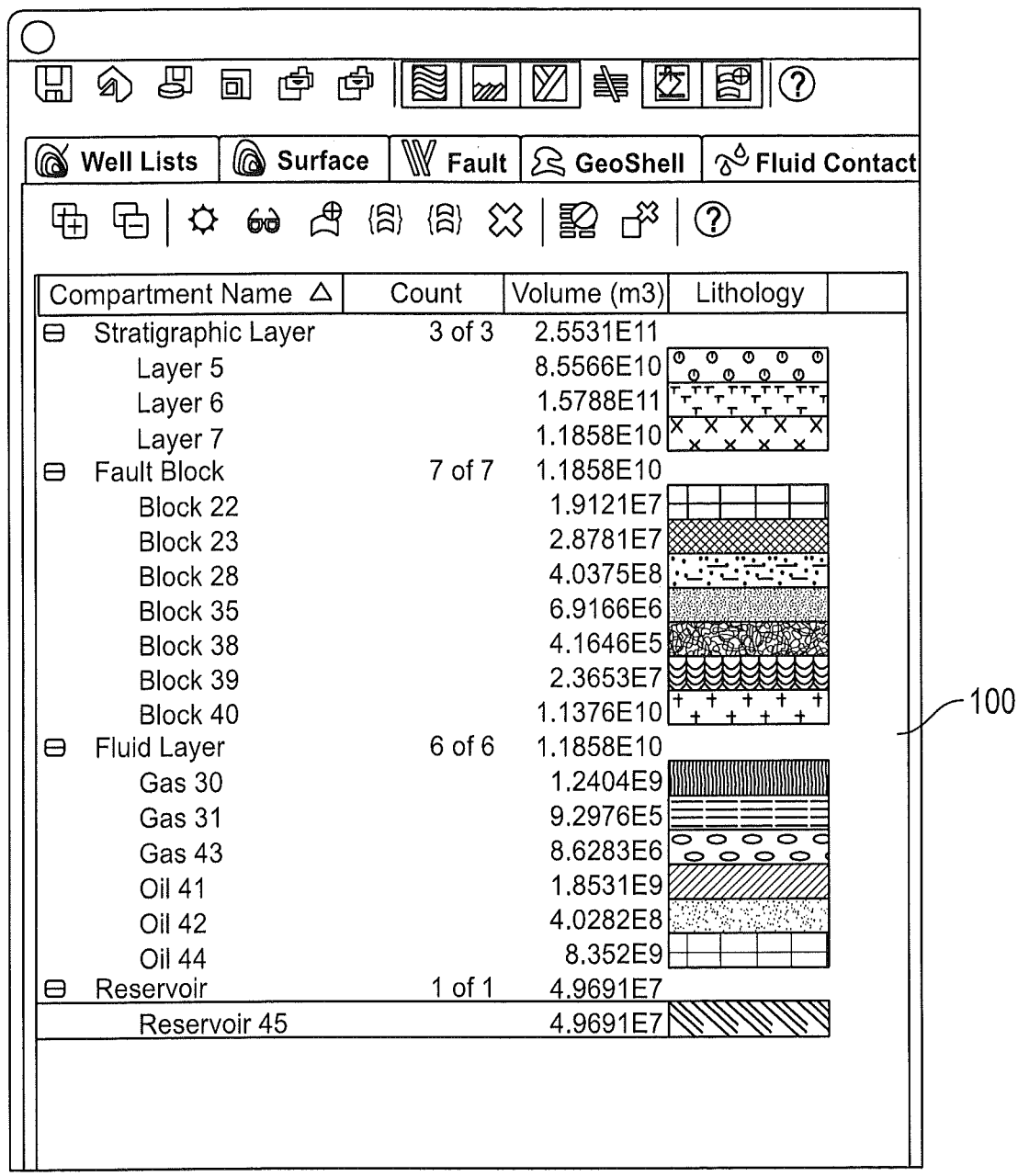
FIG. 1 is a graphical user interface illustrating various different compartments (stratigraphic layer, fault block, fluid layer, combined), user specified properties and inherent properties in an exemplary table loaded in step 2104 of FIG. 21.

The present disclosure overcomes one or more deficiencies in the prior art by providing systems and methods for dynamically updating compartments representing one or more geological structures by performing one or more dynamic interactions on i) current data; ii) a predefined polygon area-of-interest and/or predefined minimum/maximum depths from volume-of-interest based model sealing; and/or iii) a fluid contact flag and/or a sealing state from a fluid fill analysis.

In one embodiment, the present disclosure includes a method for dynamically updating compartments representing one or more geological structures, which comprises: i) loading current data; ii) extrapolating the current data against a volume of interest to produce one or more bodies; iii) extracting at least one of a stratigraphic layer and a fault block from the one or more bodies to produce at least one group of bodies with at least one of the stratigraphic layer and the fault block; iv) extracting a fluid reservoir from each group of bodies to produce a group of fluid reservoir bodies; v) converting each body in at least one of the at least one group of bodies to a respective compartment; vi) generating one or more combined compartments representing a custom reservoir using each compartment; and vii) automatically updating at least one of each compartment and each combined compartment using a computer processor.

In another embodiment, the present disclosure includes a non-transitory program carrier device tangibly carrying computer-executable instructions for dynamically updating compartments representing one or more geological structures, the instructions being executable to implement: i) loading current data; ii) extrapolating the current data against a volume of interest to produce one or more bodies; iii) extracting at least one of a stratigraphic layer and a fault block from the one or more bodies to produce at least one group of bodies with at least one of the stratigraphic layer and the fault block; iv) extracting a fluid reservoir from each group of bodies to produce a group of fluid reservoir bodies; v) converting each body in at least one of the at least one group of bodies to a respective compartment; vi) generating one or more combined compartments representing a custom reservoir using each compartment; and vii) automatically updating at least one of each compartment and each combined compartment.

In yet another embodiment, the present disclosure includes a non-transitory program carrier device tangibly carrying computer-executable instructions for dynamically updating compartments representing one or more geological structures, the instructions being executable to implement: i) loading current data; ii) extrapolating the current data against a volume of interest to produce one or more bodies; iii) extracting at least one of a stratigraphic layer and a fault block from the one or more bodies to produce at least one group of bodies with at least one of the stratigraphic layer and the fault block; iv) extracting a fluid reservoir from each group of bodies to produce a group of fluid reservoir bodies; v) converting each body in at least one of the at least one group of bodies to a respective compartment; vi) generating one or more combined compartments using each compartment; and vii) automatically updating at least one of each compartment and each combined compartment without any user interaction.

The subject matter of the present disclosure is described with specificity; however, the description itself is not intended to limit the scope of the disclosure. The subject matter thus, might also be embodied in other ways, to include different steps or combinations of steps similar to the ones described herein, in conjunction with other present or future technologies. Moreover, although the term "step" may be used herein to describe different elements of methods employed, the term should not be interpreted as implying any particular order among or between various steps herein disclosed unless otherwise expressly limited by the description to a particular order. While the present disclosure may be applied in the oil and gas industry, it is not limited thereto and may also be applied in other industries to achieve similar results.

Method Description

The present disclosure describes compartment geogrouping, which models not only the framework objects but also the sealed spaces (compartments) in between. Compartment geogrouping automatically groups compartments into different categories without user interaction. When compartments are auto-detected, they are immediately grouped into stratigraphic layers, fault blocks, fluid layers and geoshells. Fluid layers are unique in that they have fluid layer type logic and support for blocking fluid flow across faults, surfaces and/or fluid contacts. In addition, custom reservoirs can be generated by merging or intersecting other compartments. Filter tools help identify the compartment(s) of interest. Compartment geogrouping advances the basic compartment technology. It offers geologically coherent combinations of sealed spaces, which are automatically detected and updated when bounding objects change. This significantly facilitates modeling complex frameworks as well as serving as basis for highly accurate property and volumetric analysis.

This disclosure includes features that support complex geological workflows such as intrusion isolation, seamless stratigraphic layer and fault block detection, advanced fluid contact interpretation with integrated fluid layer detection, pre-defined custom reservoir generation and management, and filter tools for reservoir selection. This disclosure also includes dynamic and iterative updatability to optimize performance and make the tools more accessible. This generates a near real-time three-dimensional sealed model with inherently higher accuracy than cellular or subsampled alternatives. When compartments are auto-detected, they are immediately grouped into stratigraphic layers, fault blocks, fluid layers and geoshell volumes. The geogrouping engine keeps track of each framework object by referencing its sealing segments as individual patches. Each compartment can therefore, be assembled from its complete or a partial collection of its patches. This allows different geogrouping types to be assembled from different patch collections so interior seams (internal boundaries) or non-sealing edges can vanish from the final compartment. It also allows compartments to be merged or split automatically into overlapping regions. Geogrouping technology thus, can automatically assemble all of the individual patches into geological units on the fly.

Figure 2A:
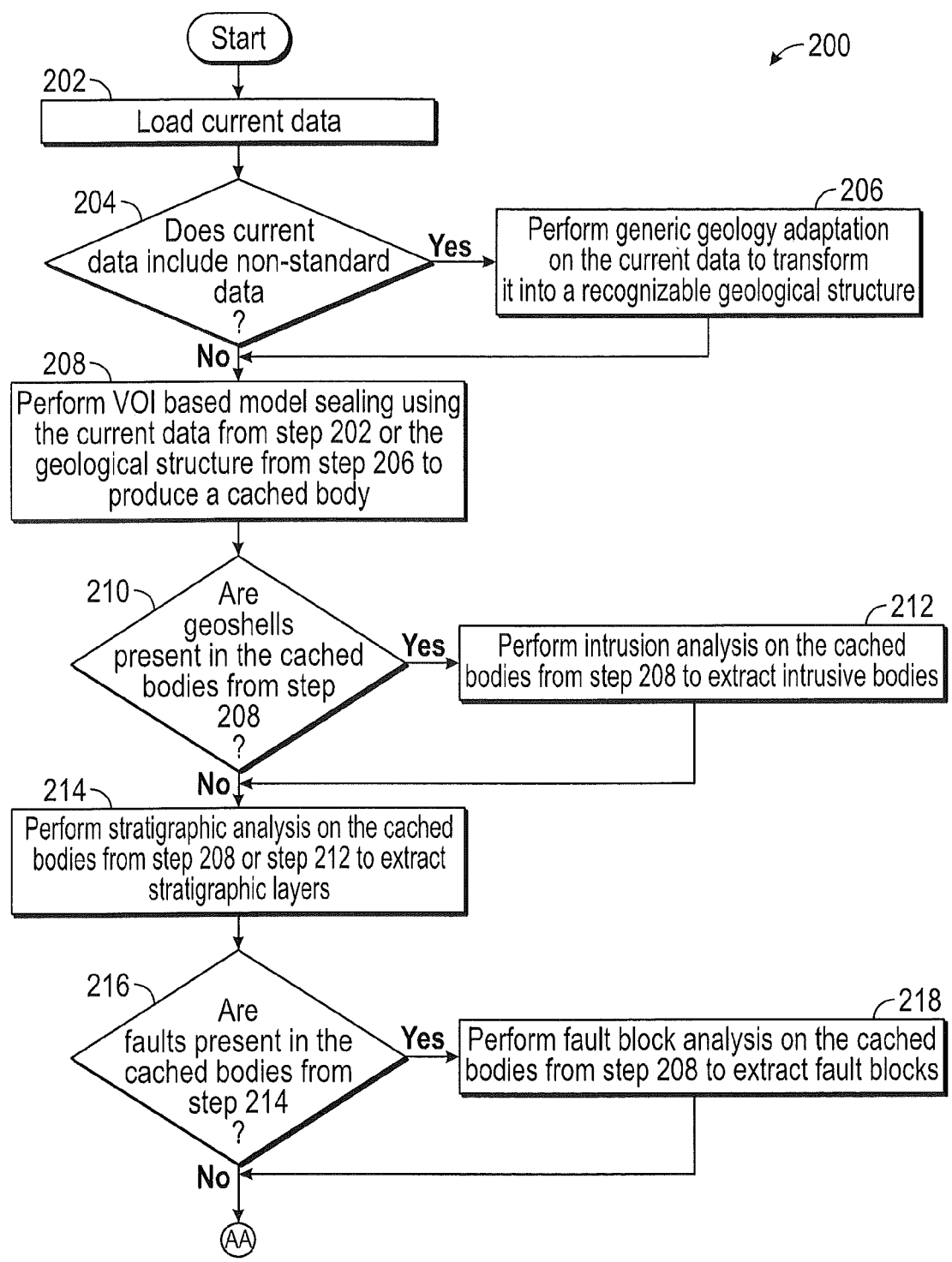
FIGS. 2A-2B are a flow diagram illustrating one embodiment of a method 200 for implementing the present disclosure.
Figure 2B:
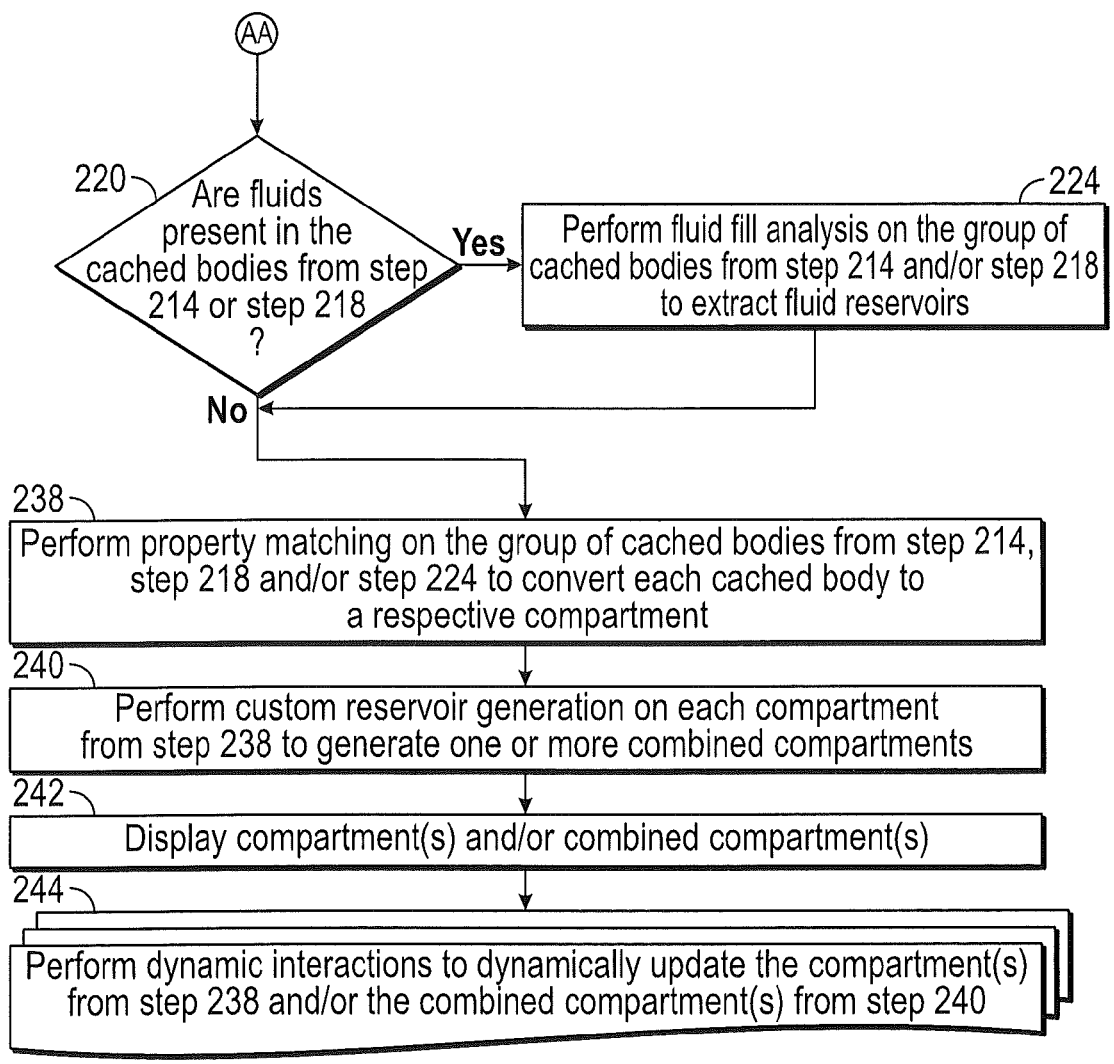

Referring now to FIGS. 2A-2B, a flow diagram of one embodiment of a method 200 for implementing the present disclosure is illustrated.

In step 202, current data comprising a plurality of source data points in a common coordinate system with predefined units is loaded into a conventional 3D modeling engine, operating in a system with predefined units, from a database.

In step 204, the method 200 determines if the current data loaded in step 202 includes non-standard data. If the current data does not include non-standard data, then the method 200 proceeds to step 208. Otherwise, the method 200 proceeds to step 206.

In step 206, generic geology adaptation is performed on the current data from step 202 to transform it into a recognizable geological structure such as, for example, a gridded surface. One embodiment of a method for performing this step is described further in reference to FIG. 3.

In step 208, Volume of Interest (VOI) based model sealing is performed using the current data from step 202 or the geological structure from step 206 to extrapolate the current data or the geological structure against the VOI to produce a cached body. In this manner arbitrary extents may be used within the model. Each cached body includes a top patch, a side patch and bottom patch, (each of which may be associated with a surface, a fault or a fluid contact), a center of mass and a volume. One embodiment of a method for performing this step is described further in reference to FIGS. 4A-4B.

In step 210, the method 200 determines if geoshells are present in the cached bodies from step 208. If geoshells are not present, then the method 200 proceeds to step 214. Otherwise, the method 200 proceeds to step 212.

In step 212, an intrusion analysis is performed on the cached bodies from step 208 to isolate and extract any intrusive bodies. One embodiment of a method for performing this step is described further in reference to FIG. 7.

In step 214, a stratigraphic analysis is performed on the cached bodies from step 208 or step 212 to extract stratigraphic layers from the cached bodies. One embodiment of a method for performing this step is described further in reference to FIGS. 10A-10B.

In step 216, the method 200 determines if faults are present in the cached bodies from step 214. If faults are not present, then the method 200 proceeds to step 220. Otherwise, the method 200 proceeds to step 218.

In step 218, a fault block analysis is performed on the cached bodies from step 208 to extract fault blocks from the cached bodies. One embodiment of a method for performing this step is described further in reference to FIGS. 13A-13B.

In step 220, the method 200 determines if fluids are present in the cached bodies from step 214 or step 218. If fluids are not present, then the method 200 proceeds to step 238. Otherwise, the method 200 proceeds to step 224.

In step 224, a fluid fill analysis is performed on the group of cached bodies from step 214 and/or step 218 using advanced fluid fill analysis algorithms to extract fluid reservoirs from the geological structure represented by the group of cached bodies. One embodiment of a method for performing this step is described further in reference to FIGS. 20A-20D.

In step 238, property matching is performed on the group of cached bodies from step 214, step 218 and/or step 224 to convert each cached body to a respective compartment represented by a triangulated mesh of the bounding cached body with properties such as color and lithology. One embodiment of a method for performing this step is described further in reference to FIGS. 21A-21C.

In step 240, custom reservoir generation is performed on each compartment from step 238 to generate one or more combined compartments. This allows intersection and union algorithms to sit on top of other compartments, which allows combined compartments to be generated automatically. One embodiment of a method for performing this step is described further in reference to FIGS. 23A-23B.

Figure 6:
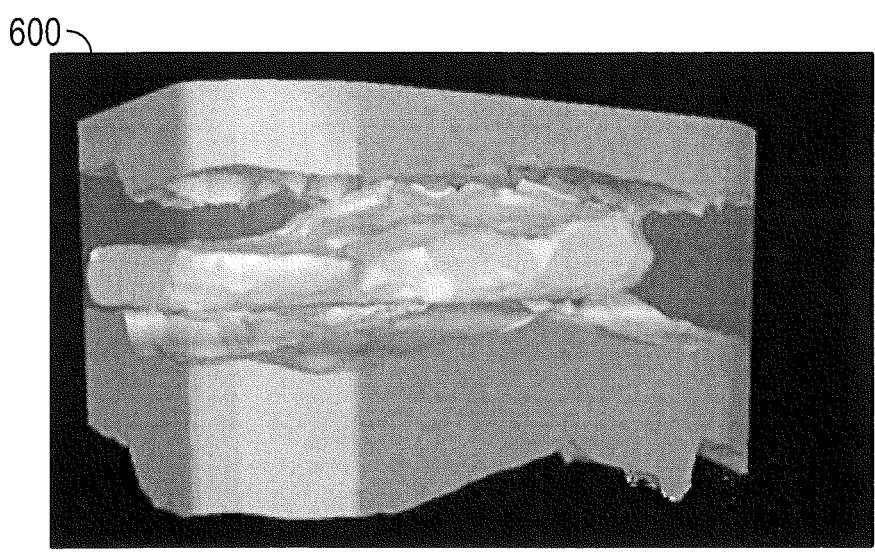
FIG. 6 is a display illustrating an exemplary three-dimensional geoshell volume compartment.
Figure 9:
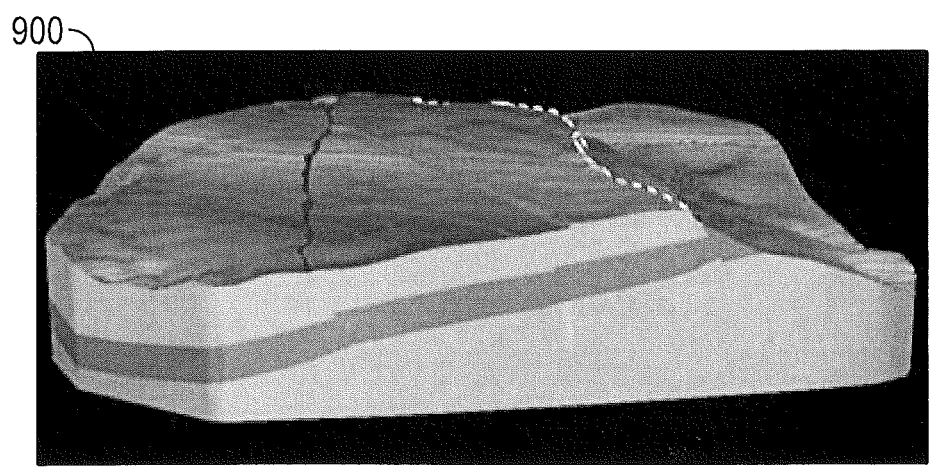
FIG. 9 is a display illustrating an exemplary three-dimensional stratigraphic layer compartment.
Figure 12:
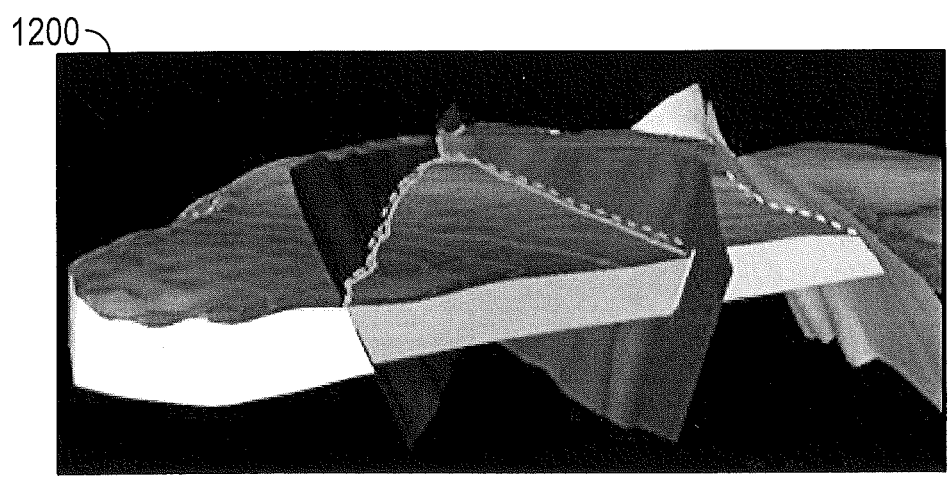
FIG. 12 is a display illustrating an exemplary three-dimensional fault block compartment.
Figure 15:
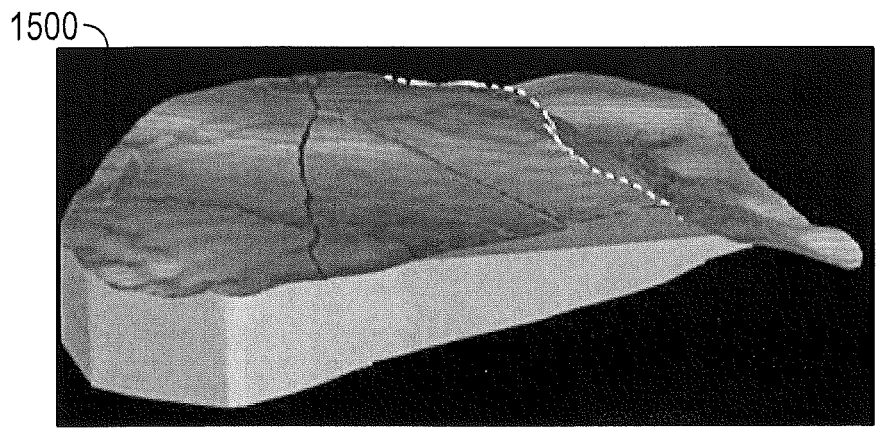
FIG. 15 is a display illustrating an exemplary three-dimensional fluid layer compartment.
Figure 16:
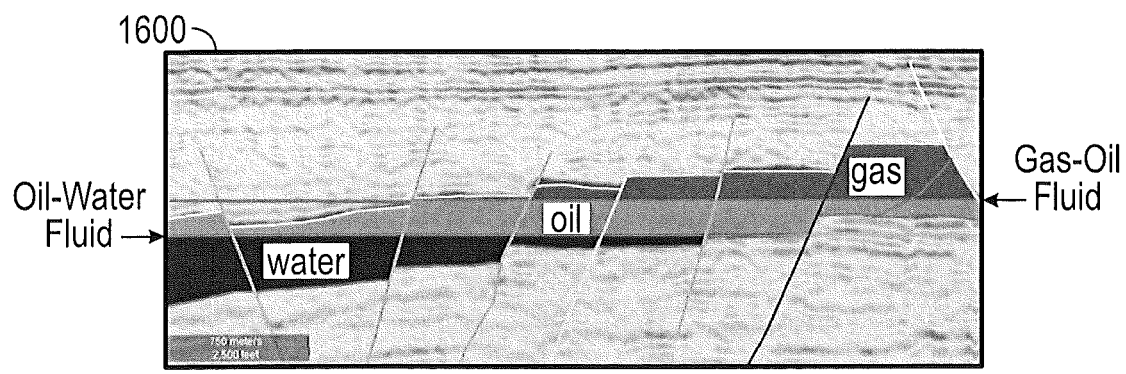
FIG. 16 is a display illustrating multiple groups of cached bodies for respective fluid reservoirs returned in step 2038 of FIG. 20.
Figure 17:
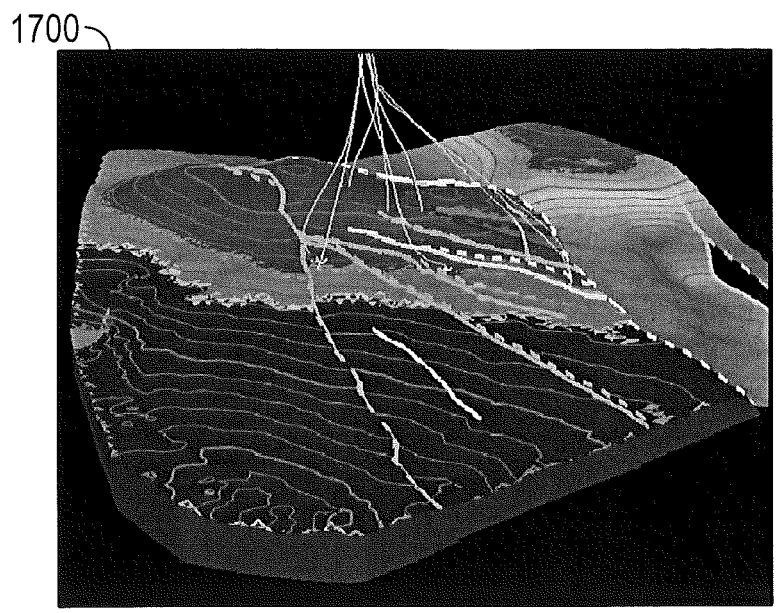
FIG. 17 is another display illustrating multiple groups of cached bodies for respective fluid reservoirs returned in step 2038 of FIG. 20.
Figure 18:
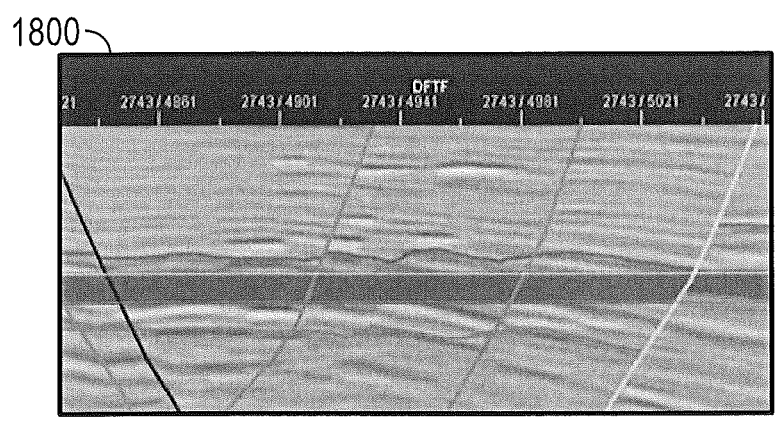
FIG. 18 is another display illustrating multiple groups of cached bodies for respective fluid reservoirs returned in step 2038 of FIG. 20.
Figure 19:
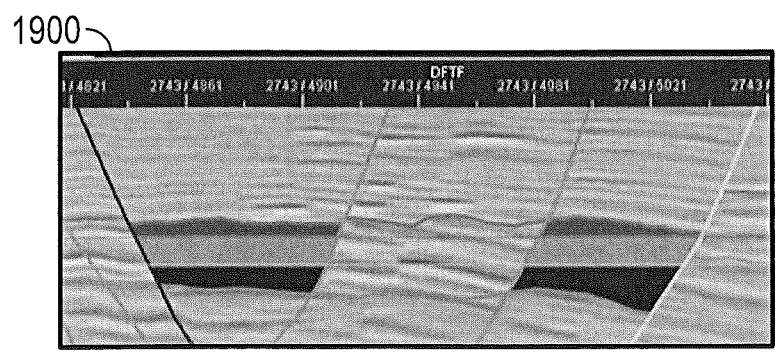
FIG. 19 is another display illustrating multiple groups of cached bodies for respective fluid reservoirs returned in step 2038 of FIG. 20.
Figure 20A:
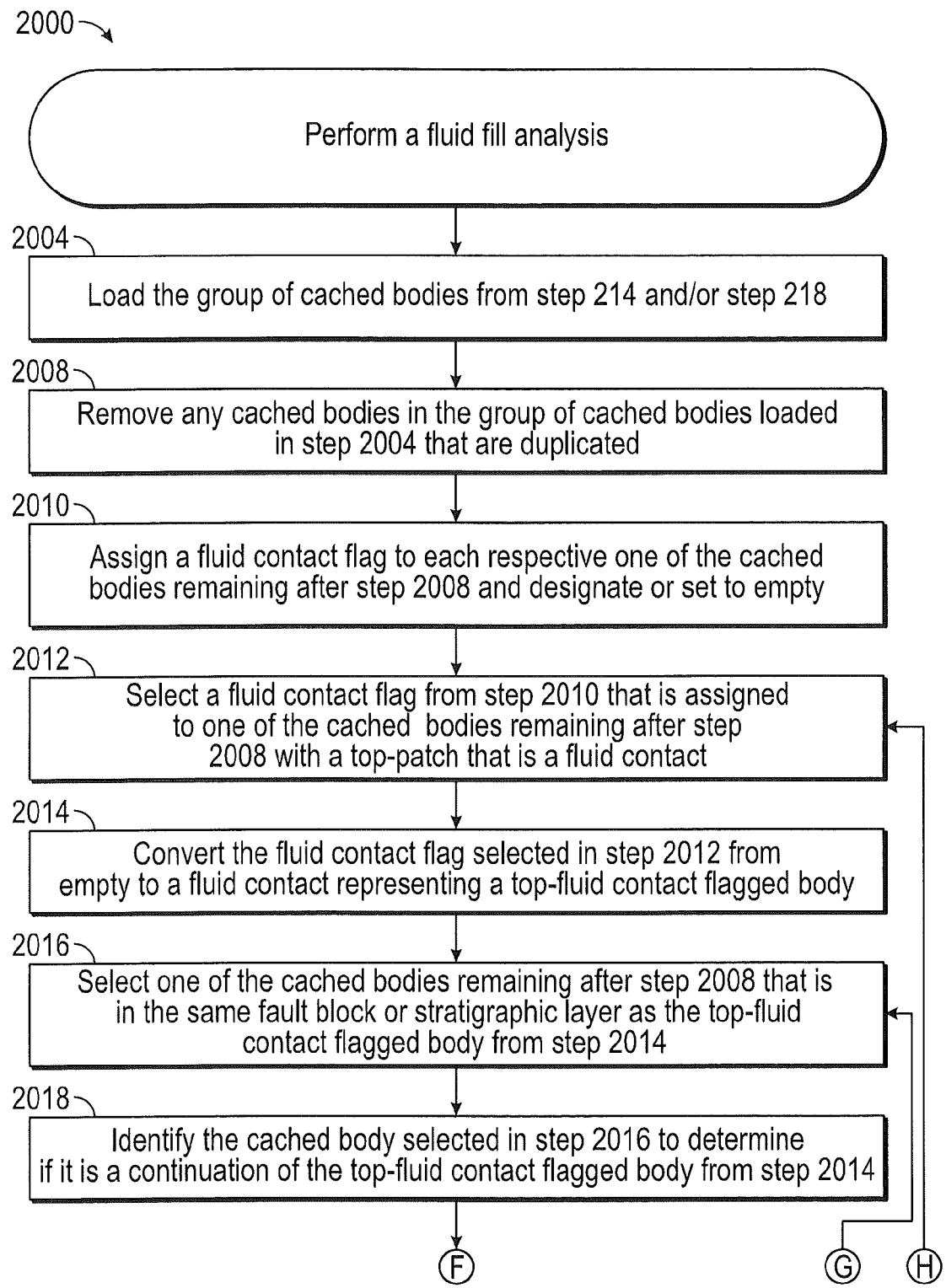
FIGS. 20A-20D are a flow diagram illustrating one embodiment of a method 2000 for implementing step 224 in FIG. 2.
Figure 20B:
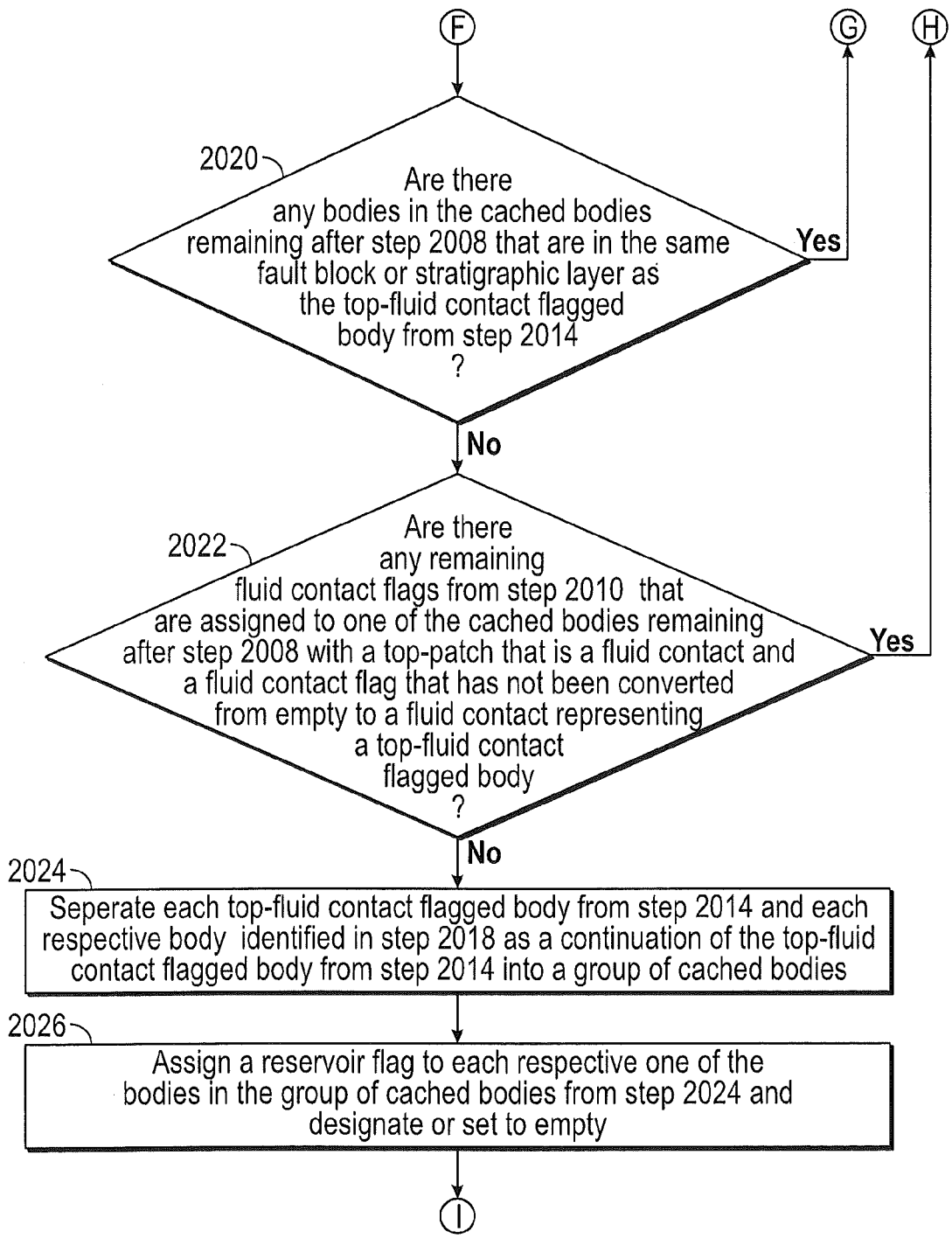
Figure 20C:
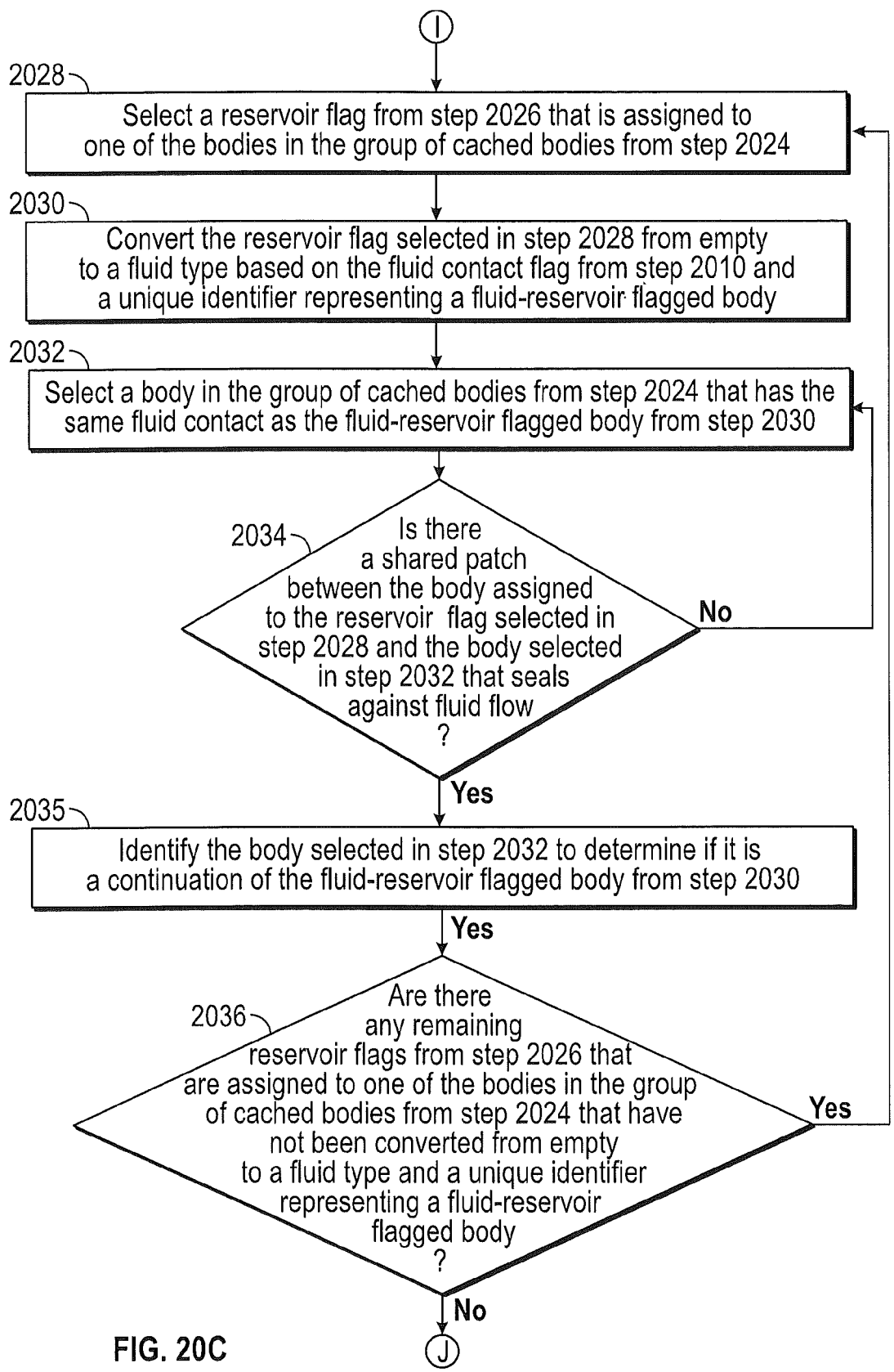
Figure 20D:
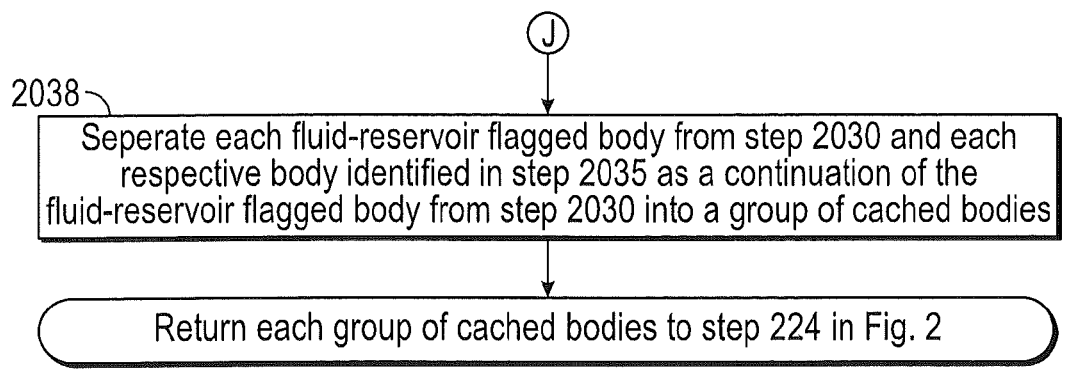

In step 242, the compartments from step 238 and/or the combined compartments from step 240 may be displayed. In FIGS. 6, 9, 12 and 15, various exemplary displays illustrate the different compartments that may be displayed. In FIG. 6, the display 600 illustrates an exemplary three-dimensional geoshell volume compartment. In FIG. 9, the display 900 illustrates an exemplary three-dimensional stratigraphic layer compartment. In FIG. 12, the display 1200 illustrates an exemplary three-dimensional fault block compartment. In FIG. 15, the display 1500 illustrates an exemplary three-dimensional fluid layer compartment.

In step 244, one or more dynamic interactions are performed on the current data loaded in step 202, the predefined polygon AOI and the predefined minimum/maximum depths from the VOI based model sealing performed in step 208 and/or the fluid contact flag and the sealing state from the fluid fill analysis performed in step 224 to dynamically update the compartments from step 238 and/or the combined compartments from step 240. One embodiment of a method for performing this step is described further in reference to FIG. 24.

Generic Geology Adaptation

Figure 3:
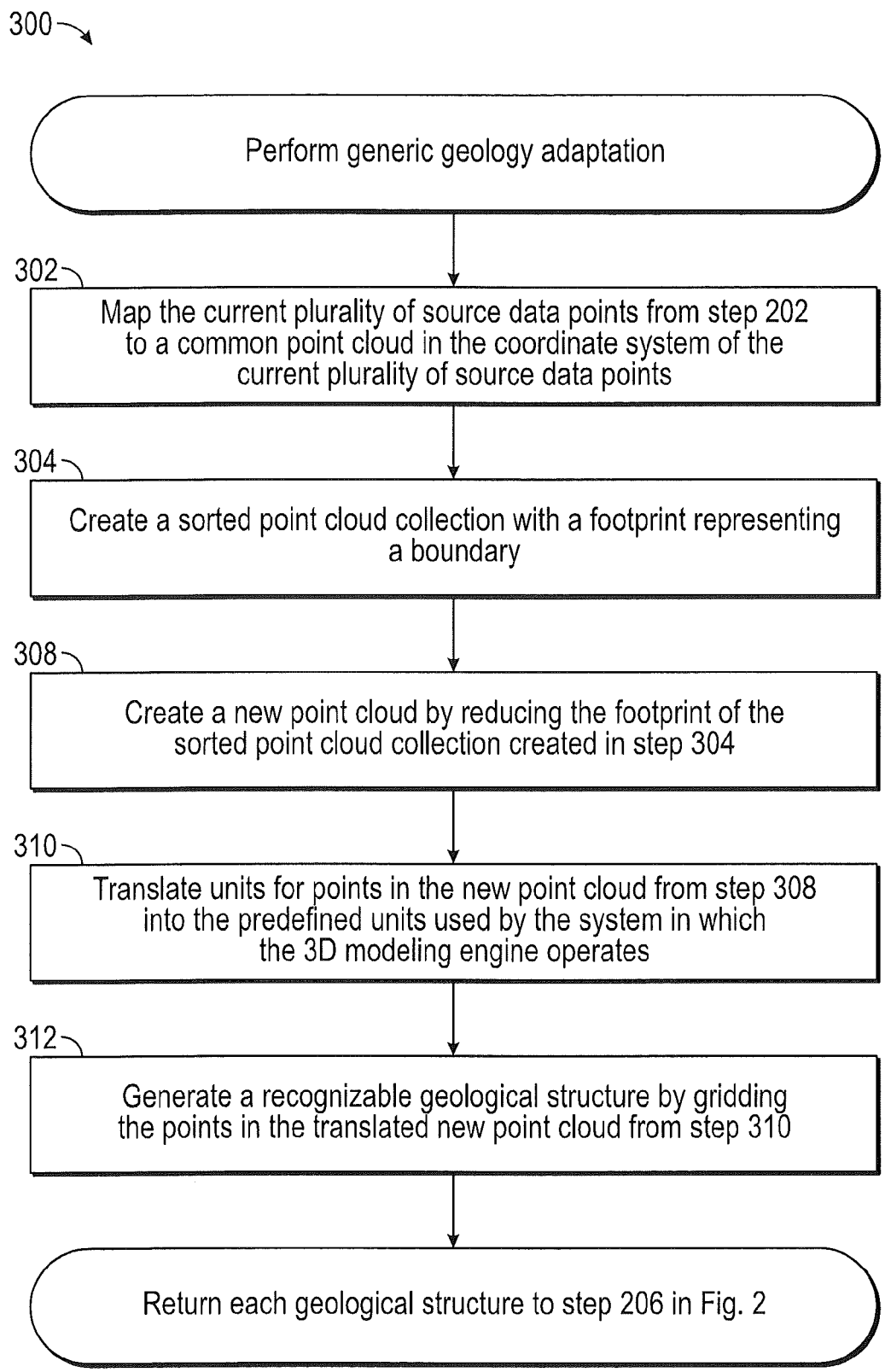
FIG. 3 is a flow diagram illustrating one embodiment of a method 300 for implementing step 206 in FIG. 2.

Referring now to FIG. 3, a flow diagram of one embodiment of a method 300 for implementing step 206 in FIG. 2 is illustrated. The method 300 performs a generic geology adaptation on the current data from step 202 to transform it into a recognizable geological structure such as, for example, a gridded surface. When combined with the fluid fill analysis from step 224, gas and oil filled reservoirs may be interpreted with a higher degree of accuracy. When combined with the fluid fill analysis from step 224 and the custom reservoir generation from step 240, the differences between measurement techniques, min and max cases, or fluid level variation through time may be evaluated. Typically, fluid contacts can only be represented as a flat plane or a predefined grid. The method 300, however, allows any current data source such as, for example, hand digitized polylines to be transformed into fluid contacts in the 3D modeling engine as one example of a recognizable geological structure.

In step 302, the current plurality of source data points loaded in step 202 is mapped to a common point cloud in the coordinate system of the current plurality of source data points using the 3D modeling engine and techniques well known in the art. In this manner, a common point collection is mapped to a common point cloud.

In step 304, a sorted point cloud collection with a footprint representing a boundary is created by sorting points in the common point cloud from step 302 according to a distance of each of the current plurality of source data points from an origin, first by a length of a z-vector in the z-axis and then by a length of an x-y vector across the x and y axes, using techniques well known in the art.

In step 308, a new point cloud is created by reducing the footprint of the sorted point cloud collection created in step 304 using the 3D modeling engine and techniques well known in the art.

In step 310, units for points in the new point cloud from step 308 are translated into the predefined units used by the system in which the 3D modeling engine operates using techniques well known in the art.

In step 312, a recognizable geological structure is generated such as, for example, a gridded surface by gridding the points in the translated new point cloud from step 310 using the 3D modeling engine and techniques well known in the art. Each geological structure is returned to step 206 in FIG. 2.

VOI Based Model Sealing

Figure 4A:
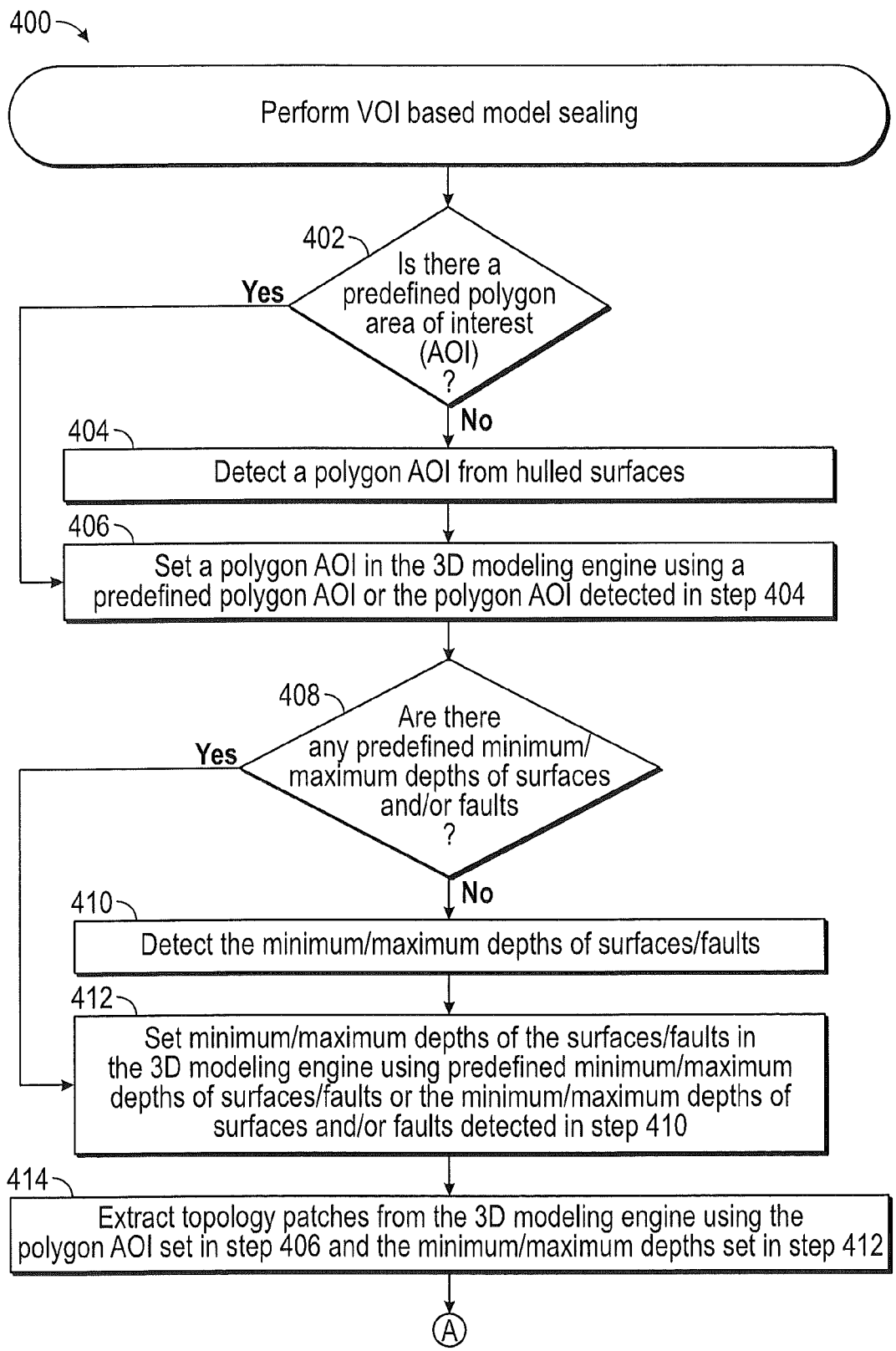
FIGS. 4A-4B are a flow diagram illustrating one embodiment of a method 400 for implementing step 208 in FIG. 2.
Figure 4B:
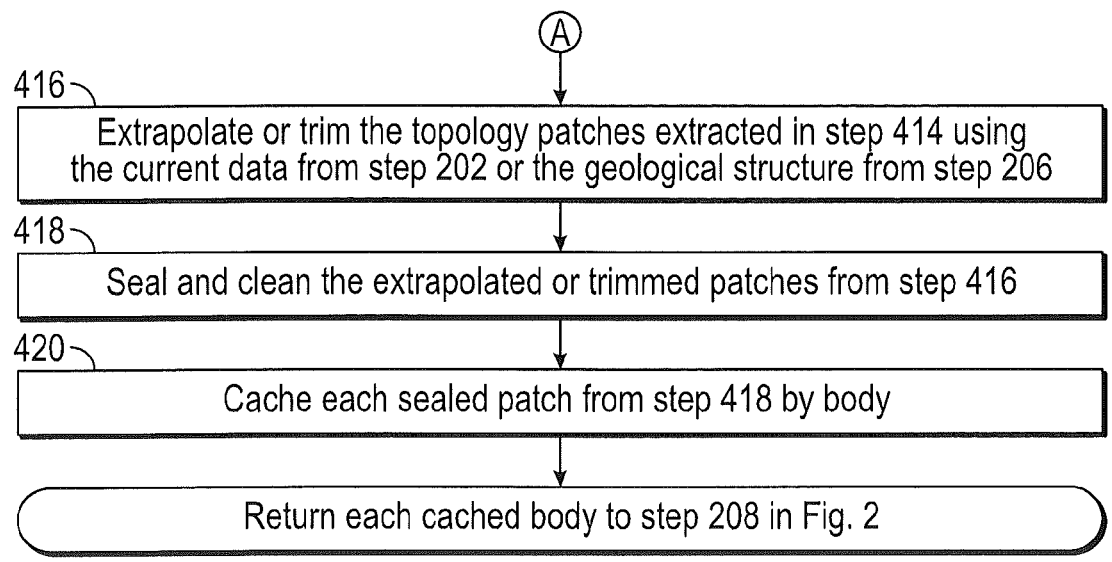

Referring now to FIGS. 4A-4B, a flow diagram of one embodiment of a method 400 for implementing step 208 in FIG. 2 is illustrated. The method 400 performs Volume of Interest (VOI) based model sealing using the current data from step 202 or the geological structure from step 206 to extrapolate the current data or the geological structure against the VOI to produce a cached body. In this manner, arbitrary extents may be used within the model that are different than the extents of the structural framework. Thus, the model may be used to restrict the compartment generation to a desired trap when working in a trap within a larger basin. The method 400 provides a performance improvement and a varying level of resolution. Further, the model generated by method 400 can also be extended vertically to allow deeper estimates. Typically, a model is always generated based on the hulled extents of all surfaces and an internal padding value. The method 400, however, uses a well-known algorithm for sealed model constraints to specify a full volume of interest or automatically calculate a smarter default for any unspecified information.

In step 402, the method 400 determines if there is a predefined polygon area of interest (AOI). If there is a predefined polygon AOI, then the method 400 proceeds to step 406. Otherwise, the method 400 proceeds to step 404.

In step 404, a polygon AOI is detected from hulled surfaces using techniques well known in the art.

In step 406, a polygon AOI is set in the 3D modeling engine using a predefined polygon AOI or the polygon AOI detected in step 404.

In step 408, the method 400 determines if there are any predefined minimum/maximum depths of surfaces and/or faults. If there are predefined minimum/maximum depths of surfaces and/or faults, then the method 400 proceeds to step 412. Otherwise, the method 400 proceeds to step 410.

In step 410, the minimum/maximum depths of surfaces/faults are detected. The minimum/maximum depths are detected by direct accumulation of modeled surface and fault extents. Modeled objects are queried in a loop and the minimum/maximum depths are stored. In this manner, the upper most and lower most compartments will properly seal.

In step 412, minimum/maximum depths of the surfaces/faults are set in the 3D modeling engine using predefined minimum/maximum depths of surfaces/faults or the minimum/maximum depths of surfaces and/or faults detected in step 410.

In step 414, topology patches are extracted from the 3D modeling engine using the polygon AOI set in step 406, the minimum/maximum depths set in step 412 and techniques well known in the art. Each topology patch represents a triangulated mesh patch.

In step 416, the topology patches extracted in step 414 are extrapolated or trimmed using the current data from step 202 or the geological structure from step 206, and techniques well known in the art. If a patch is smaller than the polygon AOI, then conventional extrapolation is performed with zero dip. In this step, however, an average dip is used near the point of extrapolation providing a result with more consistency in parallel bedding. In cases where the patch is smaller, the triangulated mesh may be trimmed to the polygon AOI using techniques well known in the art.

In step 418, the extrapolated or trimmed patches from step 416 are sealed and cleaned using techniques well known in the art. In this manner, each extrapolated or trimmed patch is sealed against the other extrapolated or trimmed patches and any overlap is trimmed to the bounding edge.

In step 420, each sealed patch from step 418 is cached by body. In other words, each sealed patch is grouped as a solid body with the extrapolated or trimmed patches from step 416. Each cached body includes a center of mass and volume. Each patch contains a symbolic link back to the bounding topology structure, which allows query by structure. The structure also allows navigation by top, side, or bottom structure query, i.e. what body is below. Each cached body is returned to step 208 in FIG. 2.

Intrusion Analysis

Figure 7:
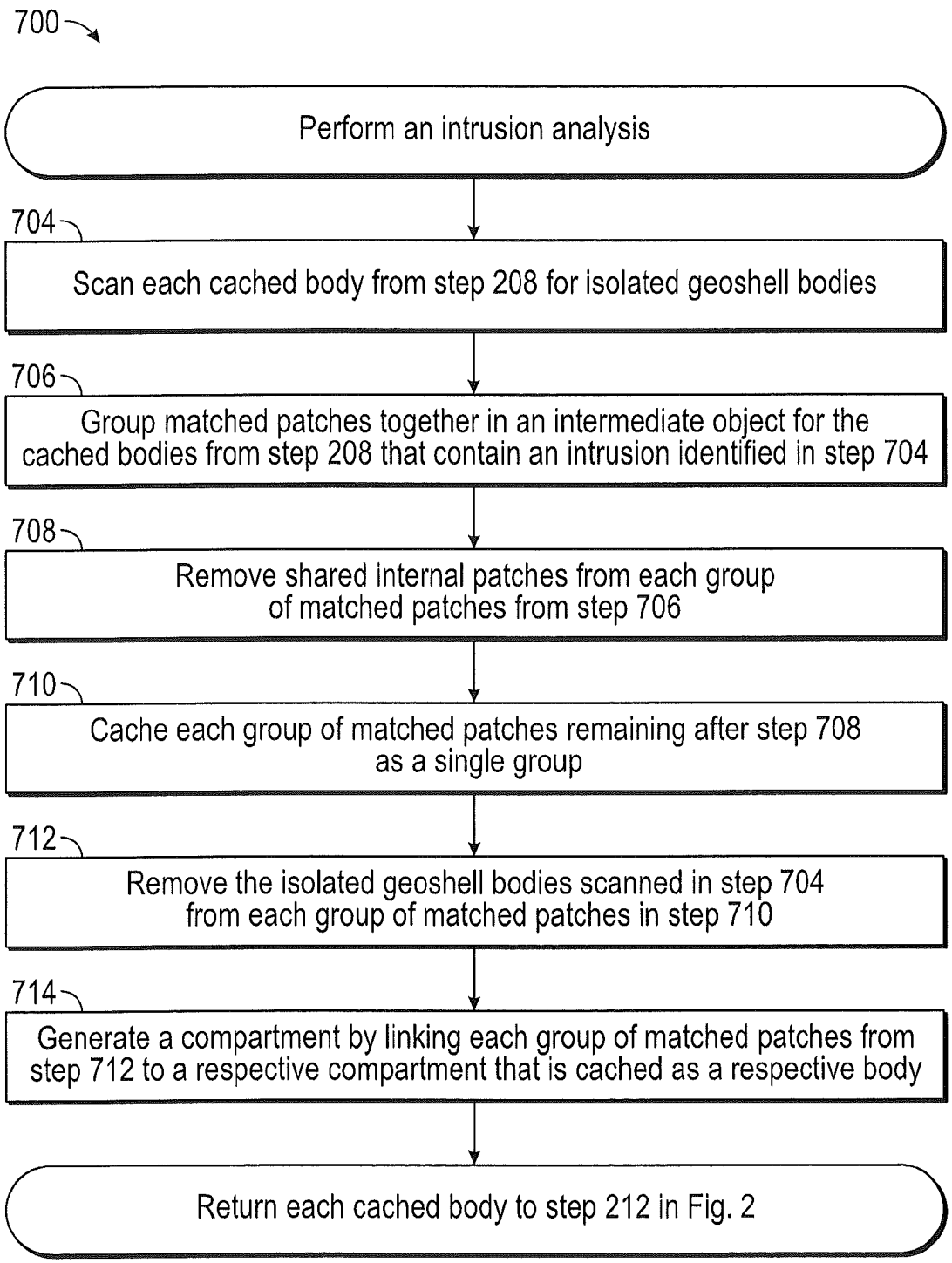
FIG. 7 is a flow diagram illustrating one embodiment of a method 700 for implementing step 212 in FIG. 2.

Referring now to FIG. 7, a flow diagram of one embodiment of a method 700 for implementing step 212 in FIG. 2 is illustrated. The method 700 performs an intrusion analysis on the cached bodies from step 208 to isolate and extract any intrusive bodies (e.g. geoshells). Geoshells are data objects used to represent uncharacteristic complex geometries such as salt bodies. Geoshells are separated as a compartment group called geoshell volumes, which are automatically subtracted from volumetric calculations of stratigraphic layers, fault blocks, and fluid layers because they typically represent different properties from the surrounding rock. The method 700 may be performed immediately after each sealed patch is cached by body in step 208. No additional access to the topology engine is required from this point forward. In conventional applications, all intrusions are seamed combinations of stratigraphic layers that require manual disassembly and reassembly. The method 700, however, automatically extracts and groups intrusions without seams.

Figure 5:
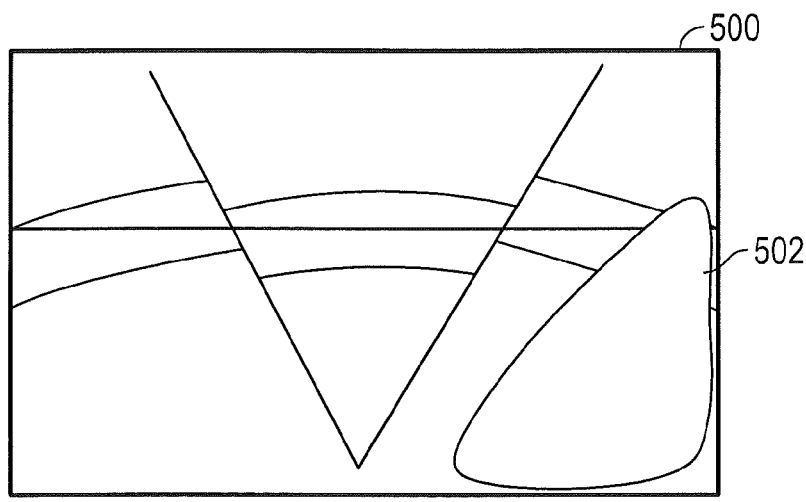
FIG. 5 is a schematic diagram illustrating the intrusion of a geoshell body scanned in step 704 of FIG. 7.

In step 704, each cached body from step 208 is scanned for isolated geoshell bodies. In this manner, the bodies will be queried for any objects that contain an intrusion (geoshell) and will identify each body that contains only an intrusion. Since a geoshell represents an intrusion, it will inherently not have seams from other structures. There could, however, still be multiple patches and internal seams from the same intrusion or other intrusions. In FIG. 5, a schematic diagram 500 illustrates the intrusion of a geoshell body 502.

In step 706, matched patches are grouped together in an intermediate object for the cached bodies from step 208 that contain an intrusion identified in step 704.

In step 708, shared internal patches are removed from each group of matched patches from step 706. All shared internal patches (e.g. duplicated or common but not an external edge) are removed from the group of matched patches using techniques well known in the art.

In step 710, each group of matched patches remaining after step 708 is cached as a single group.

In step 712, the isolated geoshell bodies scanned in step 704 are removed from each group of matched patches in step 710. Because an intrusion is not part of the surrounding stratigraphy, the isolated geoshell bodies are removed from each group of matched patches. This ensures no other geological analysis will process them.

In step 714, a compartment is generated by linking each group of matched patches from step 712 to a respective compartment that is cached as a respective body. Each compartment includes a center of mass and a volume. Each cached body is returned to step 212 in FIG. 2.

Stratigraphic Analysis

Figure 10A:
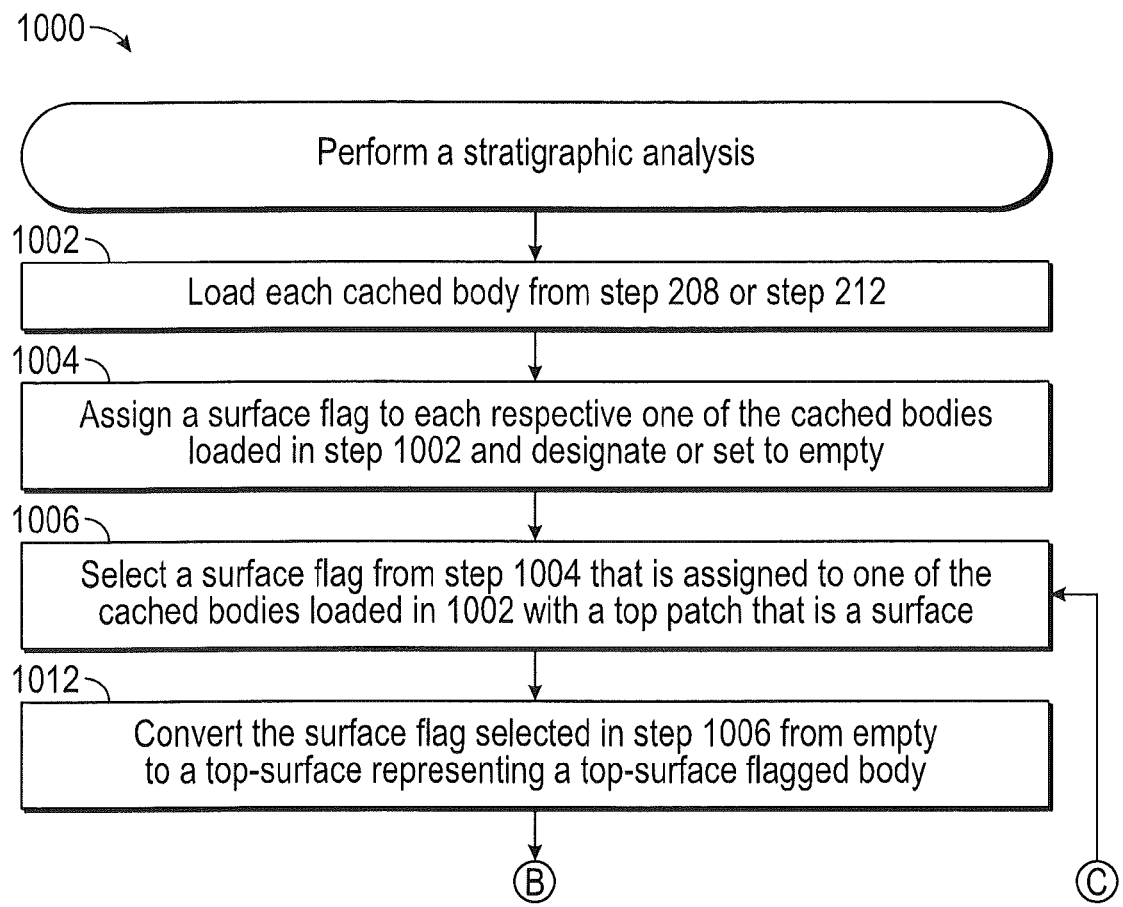
FIGS. 10A-10B are a flow diagram illustrating one embodiment of a method 1000 for implementing step 214 in FIG. 2.
Figure 10B:
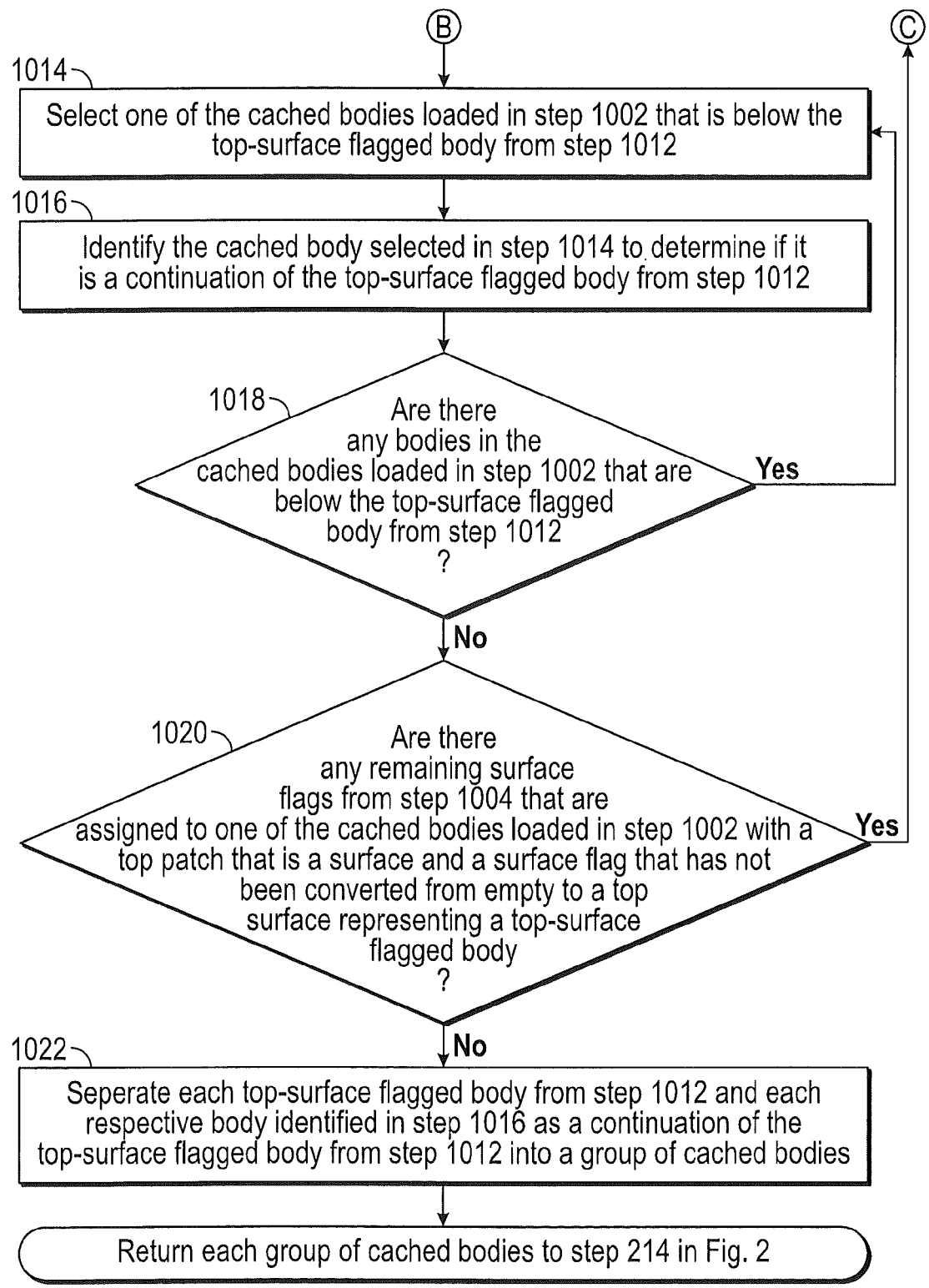

Referring now to FIGS. 10A-10B, a flow diagram of one embodiment of a method 1000 for implementing step 214 in FIG. 2 is illustrated. The method 1000 performs a stratigraphic analysis on the cached bodies from step 208 or step 212 to extract stratigraphic layers from the cached bodies. In case of surfaces with different areal extents, the compartment boundaries are extrapolated to the extents of the largest surface. A stratigraphic layer is always created above the topmost surface and below the bottommost surface, which represent arbitrary extensions into unknown rock layers. Stratigraphic layers automatically adjust to changes of the surface sources (e.g. horizons, picks) and changes to the framework model (e.g. surface AOI, algorithms etc.). In conventional applications, all stratigraphic layers are seamed of several bodies sorted by all bounding structure names and are auto-grouped in a system that creates challenges to recognition. The method 1000, however, automatically extracts stratigraphic layers and groups them without seams or intrusions for simple identification.

In step 1002, each cached body from step 208 or step 212 is loaded. Thus, each cached body includes a top patch, a center of mass and a volume.

In step 1004, a surface flag is assigned to each respective one of the cached bodies loaded in step 1002. Each surface flag is designated or set to empty.

In step 1006, a surface flag is selected from step 1004 that is assigned to one of the cached bodies loaded in 1002 with a top patch that is a surface.

In step 1012, the surface flag selected in step 1006 is converted from empty to a top-surface representing a top-surface flagged body.

In step 1014, one of the cached bodies loaded in step 1002 that is below the top-surface flagged body from step 1012 is selected.

In step 1016, the cached body selected in step 1014 is identified to determine if it is a continuation of the top-surface flagged body from step 1012.

In step 1018, the method 1000 determines if there are any bodies in the cached bodies loaded in step 1002 that are below the top-surface flagged body from step 1012. If there are bodies in the cached bodies loaded in step 1002 that are below the top-surface flagged body from step 1012, then the method 1000 returns to step 1014. Otherwise, the method 1000 proceeds to step 1020.

In step 1020, the method 1000 determines if there are any remaining surface flags from step 1004 that are assigned to one of the cached bodies loaded in step 1002 with a top patch that is a surface and a surface flag that has not been converted from empty to a top surface representing a top-surface flagged body. If there are any surface flags from step 1004 that are assigned to one of the cached bodies loaded in step 1002 with a top patch that is a surface and a surface flag that has not been converted from empty to a top surface representing a top-surface flagged body, then the method 1000 returns to step 1006. Otherwise, the method 1000 proceeds to step 1022.

Figure 8:
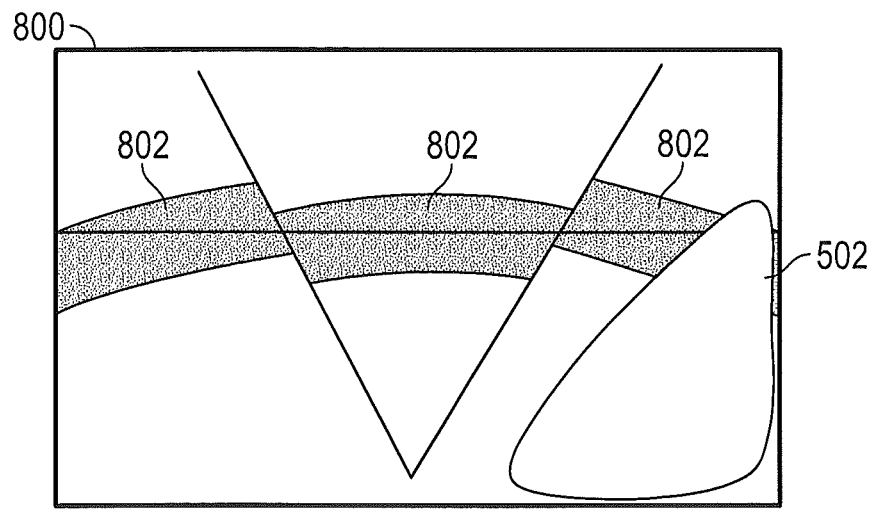
FIG. 8 is a schematic diagram illustrating a group of cached bodies for a stratigraphic layer in relation to a geoshell body returned in step 1022 of FIG. 10.

In step 1022, each top-surface flagged body from step 1012 and each respective body identified in step 1016 as a continuation of the top-surface flagged body from step 1012 are separated into a group of cached bodies. The group of cached bodies is returned to step 214 in FIG. 2. In FIG. 8, a schematic diagram 800 illustrates a group of cached bodies for a stratigraphic layer 802 in relation to the geoshell body 502 in FIG. 5.

Fault Block Analysis

Figure 13A:
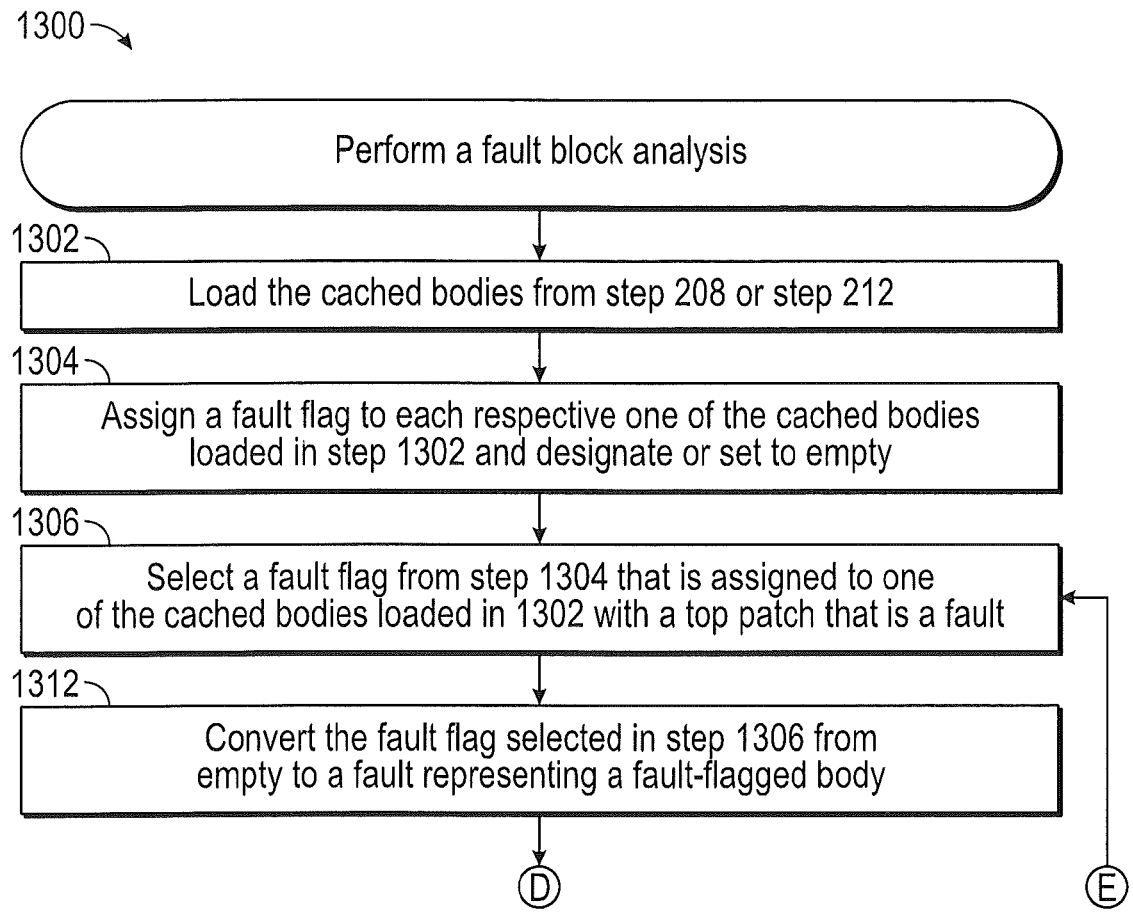
FIGS. 13A-13B are a flow diagram illustrating one embodiment of a method 1300 for implementing step 218 in FIG. 2.
Figure 13B:
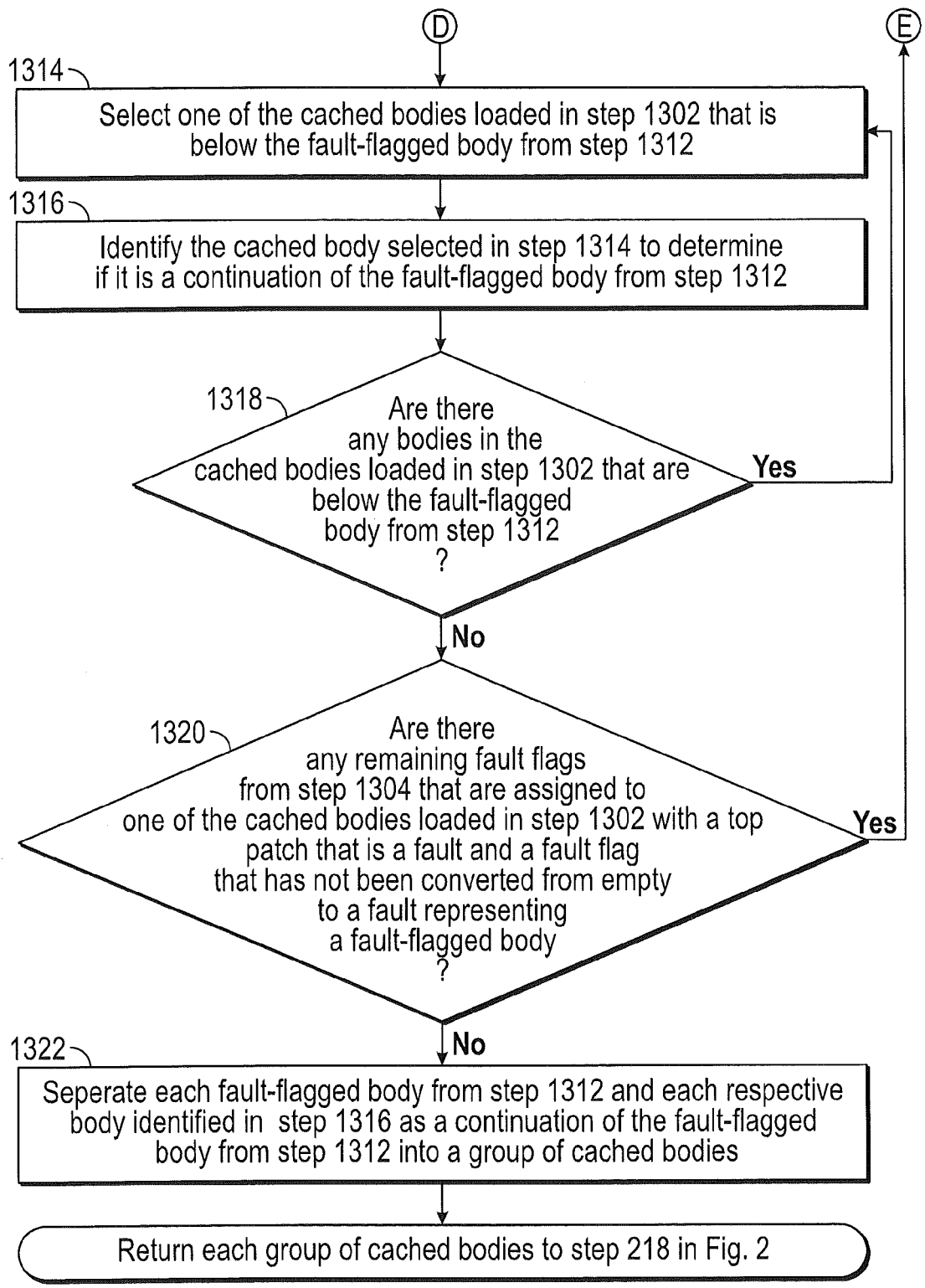

Referring now to FIGS. 13A-13B, a flow diagram of one embodiment of a method 1300 for implementing step 218 in FIG. 2 is illustrated. The method 1300 performs a fault block analysis on the cached bodies from step 208 or step 212 to extract fault blocks from the cached bodies. In many models, surfaces may be much larger than faults. Faults can be extrapolated using fault networking and a smaller compartment attribute-of-interest polygon can be specified to ensure faults can seal enough of the solid model to properly detect fault blocks. Fault blocks automatically adjust to changes of the fault sources (e.g. seismic faults, fault picks) and changes to the framework model (e.g. fault networking, fault sealing). In conventional applications, fault blocks cannot be generated due to the limitations resolved by volume-of-interest model sealing. The method 1300, however, enables fault blocks to be automatically extracted and grouped without seams. The faults may be structurally sealing and completely isolate a 3D space within two surfaces in order to be extracted. The resulting collection of individual compartments becomes a fault block. Geoshell volumes are removed against the fault blocks for the purpose of volumetric calculations.

In step 1302, the cached bodies from step 208 or step 212 are loaded. Thus, each cached body includes a side patch, a center of mass and a volume.

In step 1304, a fault flag is assigned to each respective one of the cached bodies loaded in step 1302. Each fault flag is designated or set to empty.

In step 1306, a fault flag is selected from step 1304 that is assigned to one of the cached bodies loaded in 1302 with a top patch that is a fault.

In step 1312, the fault flag selected in step 1306 is converted from empty to a fault representing a fault-flagged body.

In step 1314, one of the cached bodies loaded in step 1302 that is below the fault-flagged body from step 1312 is selected.

In step 1316, the cached body selected in step 1314 is identified to determine if it is a continuation of the fault-flagged body from step 1312.

In step 1318, the method 1300 determines if there are any bodies in the cached bodies loaded in step 1302 that are below the fault-flagged body from step 1312. If there are bodies in the cached bodies loaded in step 1302 that are below the fault-flagged body from step 1312, then the method 1300 returns to step 1314. Otherwise, the method 1300 proceeds to step 1320.

In step 1320, the method 1300 determines if there are any remaining fault flags from step 1304 that are assigned to one of the cached bodies loaded in step 1302 with a top patch that is a fault and a fault flag that has not been converted from empty to a fault representing a fault-flagged body. If there are any fault flags from step 1304 that are assigned to one of the cached bodies loaded in step 1302 with a top patch that is a fault and a fault flag that has not been converted from empty to a fault representing a fault-flagged body, then the method 1300 returns to step 1306. Otherwise, the method 1300 proceeds to step 1322.

Figure 11:
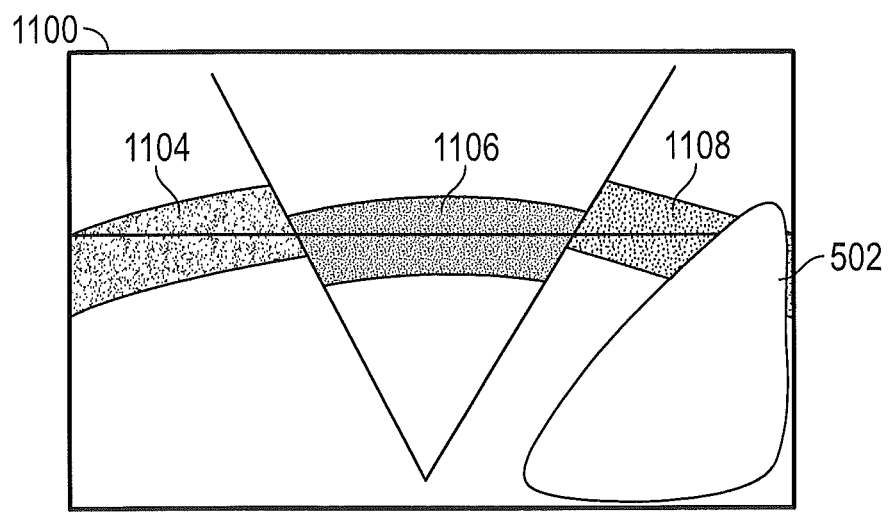
FIG. 11 is a schematic diagram illustrating three groups of cached bodies for three respective fault blocks in relation to a geoshell body returned in step 1322 of FIG. 13.

In step 1322, each fault-flagged body from step 1312 and each respective body identified in step 1316 as a continuation of the fault-flagged body from step 1312 are separated into a group of cached bodies. The group of cached bodies is returned to step 218 in FIG. 2. In FIG. 11, a schematic diagram 1100 illustrates three groups of cached bodies for three respective fault blocks 1104, 1106, and 1008 in relation to the geoshell body 502 in FIG. 5.

Fluid Fill Analysis

Referring now to FIGS. 20A-20D, a flow diagram of one embodiment of a method 2000 for implementing step 224 in FIG. 2 is illustrated. The method 2000 performs a fluid fill analysis on the group of cached bodies from step 214 and/or step 218 using advanced fluid fill analysis algorithms to extract fluid reservoirs from the geological structure represented by the cached bodies. Fluid Layers are created between fluid contacts and other fluid contacts or framework surfaces. Fluid layers are a particular compartment type defined by a fluid property such as oil, gas, water or a generic fluid. They may also be subdivided by sealing faults. In conventional applications, fluid compartments are manually grouped by individually turning them on in a view and then dragging and dropping them into a new grouping. This creates a slow, frustrating, seamed grouping with no fluid properties. The method 2000, however, enables fluid layers to be automatically detected, filled, and grouped by fluid type.

In step 2004, the group of cached bodies from step 214 and/or step 218 is loaded. Thus, each cached body in either group includes a top patch, a center of mass and a volume.

In step 2008, any cached bodies in the group of cached bodies loaded in step 2004 that are duplicated are removed.

In step 2010, a fluid contact flag is assigned to each respective one of the cached bodies remaining after step 2008. Each fluid contact flag is designated or set to empty.

In step 2012, a fluid contact flag is selected from step 2010 that is assigned to one of the cached bodies remaining after step 2008 with a top-patch that is a fluid contact.

In step 2014, the fluid contact flag selected in step 2012 is converted from empty to a fluid contact representing a top-fluid contact flagged body.

In step 2016, one of the cached bodies remaining after step 2008 that is in the same fault block or stratigraphic layer as the top-fluid contact flagged body from step 2014 is selected.

In step 2018, the cached body selected in step 2016 is identified to determine if it is a continuation of the top-fluid contact flagged body from step 2014.

In step 2020, the method 2000 determines if there are any bodies in the cached bodies remaining after step 2008 that are in the same fault block or stratigraphic layer as the top-fluid contact flagged body from step 2014. If there are bodies in the cached bodies remaining after step 2008 that are in the same fault block or stratigraphic layer as the top-fluid contact flagged body from step 2014, then the method 2000 returns to step 2016. Otherwise, the method 2000 proceeds to step 2022.

In step 2022, the method 2000 determines if there are any remaining fluid contact flags from step 2010 that are assigned to one of the cached bodies remaining after step 2008 with a top-patch that is a fluid contact and a fluid contact flag that has not been converted from empty to a fluid contact representing a top-fluid contact flagged body. If there are any fluid contact flags from step 2010 that are assigned to one of the cached bodies remaining after step 2008 with a top-patch that is a fluid contact and a fluid contact flag that has not been converted from empty to a fluid contact representing a top-fluid contact flagged body, then the method 2000 returns to step 2012. Otherwise, the method 2000 proceeds to step 2024.

Figure 14:
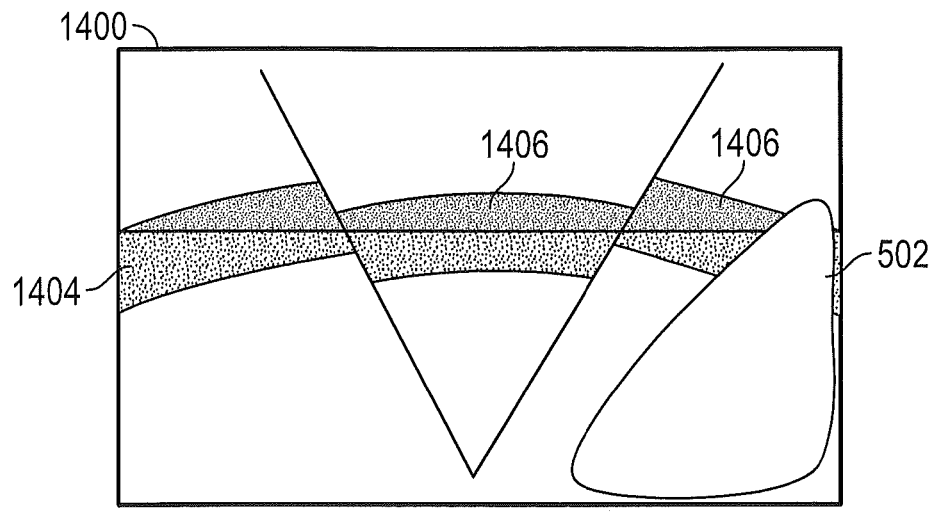
FIG. 14 is a schematic diagram illustrating two groups of cached bodies for two respective fluid layers in relation to a geoshell body returned in step 2024 of FIG. 20.

In step 2024, each top-fluid contact flagged body from step 2014 and each respective body identified in step 2018 as a continuation of the top-fluid contact flagged body from step 2014 are separated into a group of cached bodies. In FIG. 14, a schematic diagram 1400 illustrates two groups of cached bodies for respective fluid layers 1404 and 1406 in relation to the geoshell body 502 in FIG. 5.

In step 2026, a reservoir flag is assigned to each respective one of the bodies in the group of cached bodies from step 2024. Each reservoir flag is designated or set to empty.

In step 2028, a reservoir flag is selected from step 2026 that is assigned to one of the bodies in the group of cached bodies from step 2024.

In step 2030, the reservoir flag selected in step 2028 is converted from empty to a fluid type based on the fluid contact flag from step 2010 and a unique identifier (e.g. oil 17) representing a fluid-reservoir flagged body.

In step 2032, a body in the group of cached bodies from step 2024 that has the same fluid contact as the fluid-reservoir flagged body from step 2030 is selected.

Figure 25:
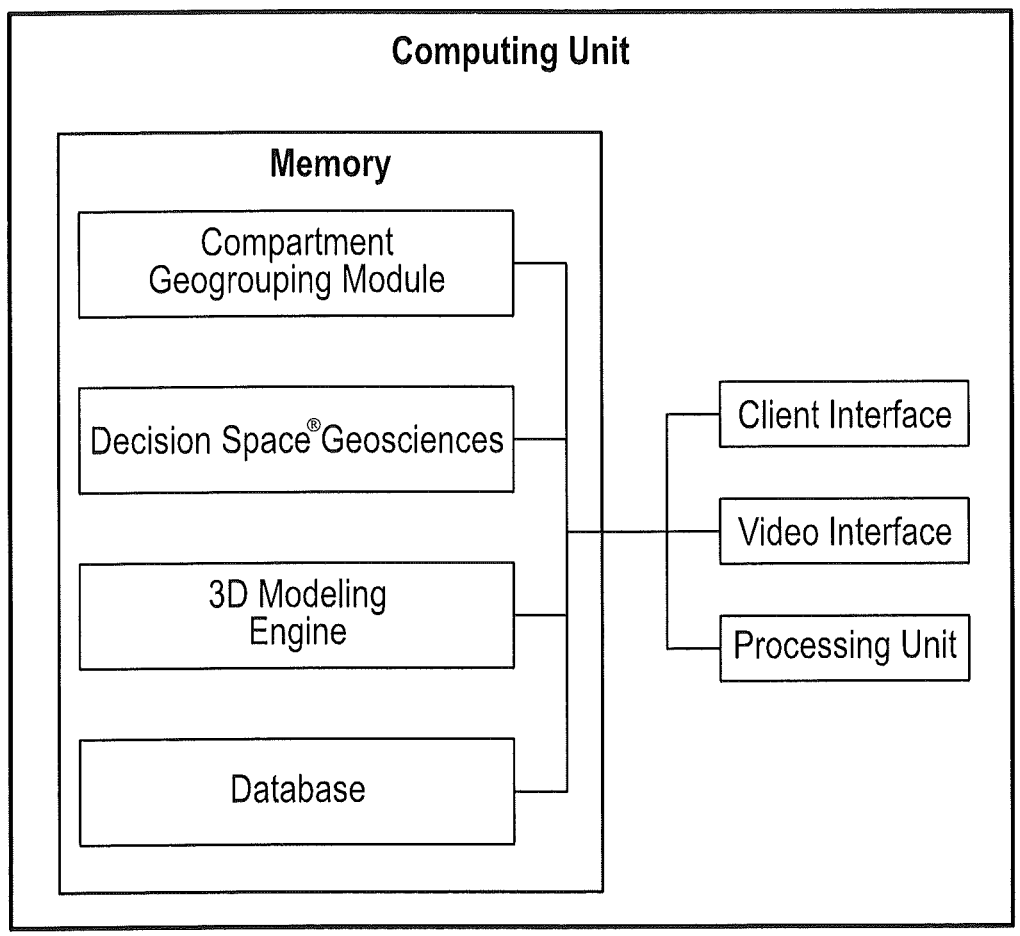
FIG. 25 is a block diagram illustrating one embodiment of a computer system for implementing the present disclosure.

In step 2034, the method 2000 determines if there is a shared patch between the body assigned to the reservoir flag selected in step 2028 and the body selected in step 2032 that seals against fluid flow using the client interface and/or the video interface described in reference to FIG. 25. If there is not a shared patch between the body assigned to the reservoir flag selected in step 2028 and the body selected in step 2032 that seals against fluid flow, then the method 2000 returns to step 2032. Otherwise, the method 2000 proceeds to step 2035.

In step 2035, the body selected in step 2032 is identified to determine if it is a continuation of the fluid-reservoir flagged body from step 2030.

In step 2036, the method 2000 determines if there are any remaining reservoir flags from step 2026 that are assigned to one of the bodies in the group of cached bodies from step 2024 that have not been converted from empty to a fluid type and a unique identifier representing a fluid-reservoir flagged body. If there are any reservoir flags from step 2026 that are assigned to one of the bodies in the group of cached bodies from step 2024 that have not been converted from empty to a fluid type and a unique identifier representing a fluid-reservoir flagged body, then the method 2000 returns to step 2028. Otherwise, the method proceeds to step 2038.

In step 2038, each fluid-reservoir flagged body from step 2030 and each respective body identified in step 2035 as a continuation of the fluid-reservoir flagged body from step 2030 are separated into a group of cached bodies. The group of cached bodies is returned to step 224 in FIG. 2. In FIGS. 16-19, various exemplary displays 1600, 1700, 1800 and 1900 illustrate multiple groups of cached bodies for respective fluid reservoirs with different sealing states.

Property Matching

Figure 21A:
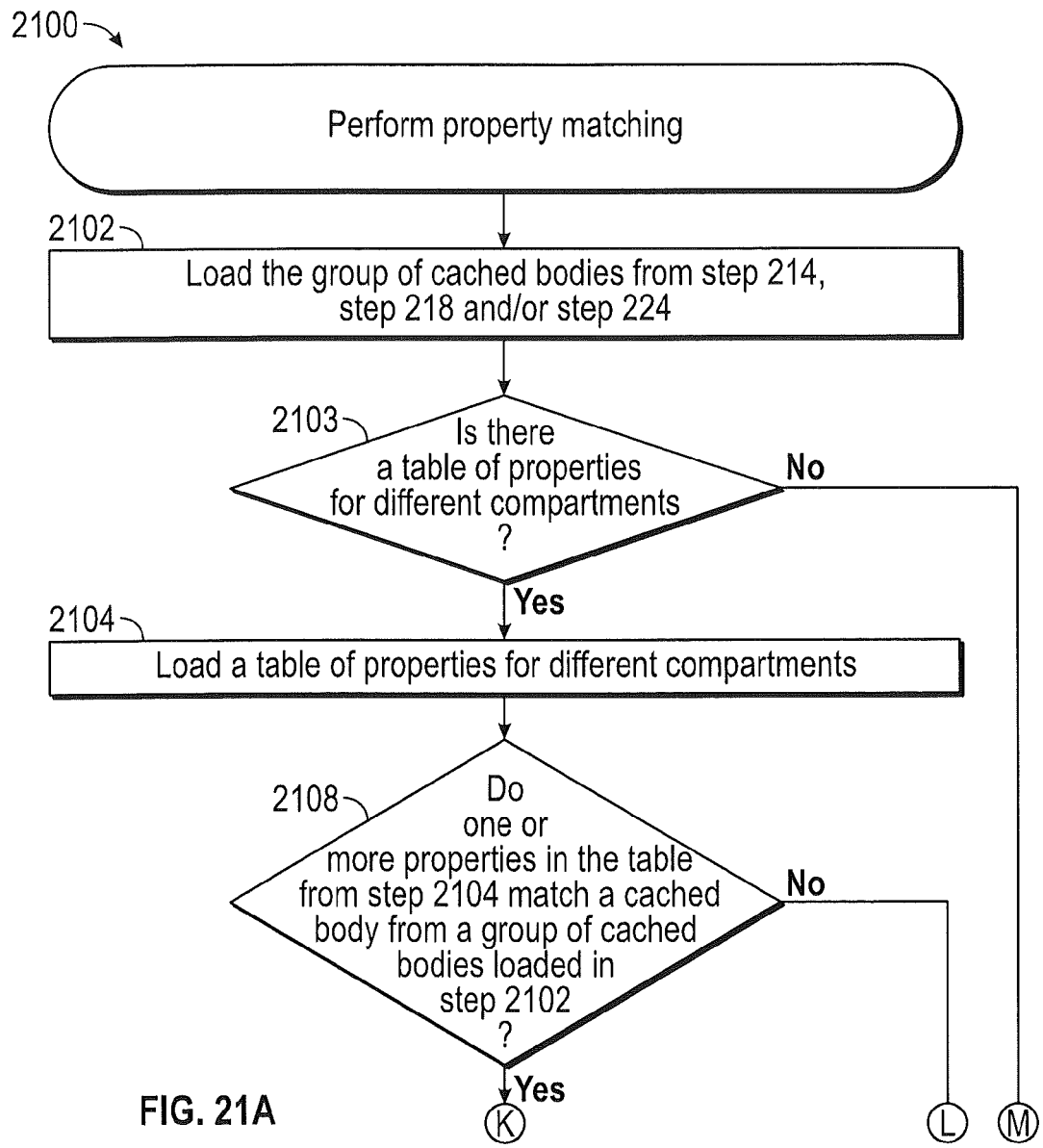
FIGS. 21A-21C are a flow diagram illustrating one embodiment of a method 2100 for implementing step 238 in FIG. 2.
Figure 21B:
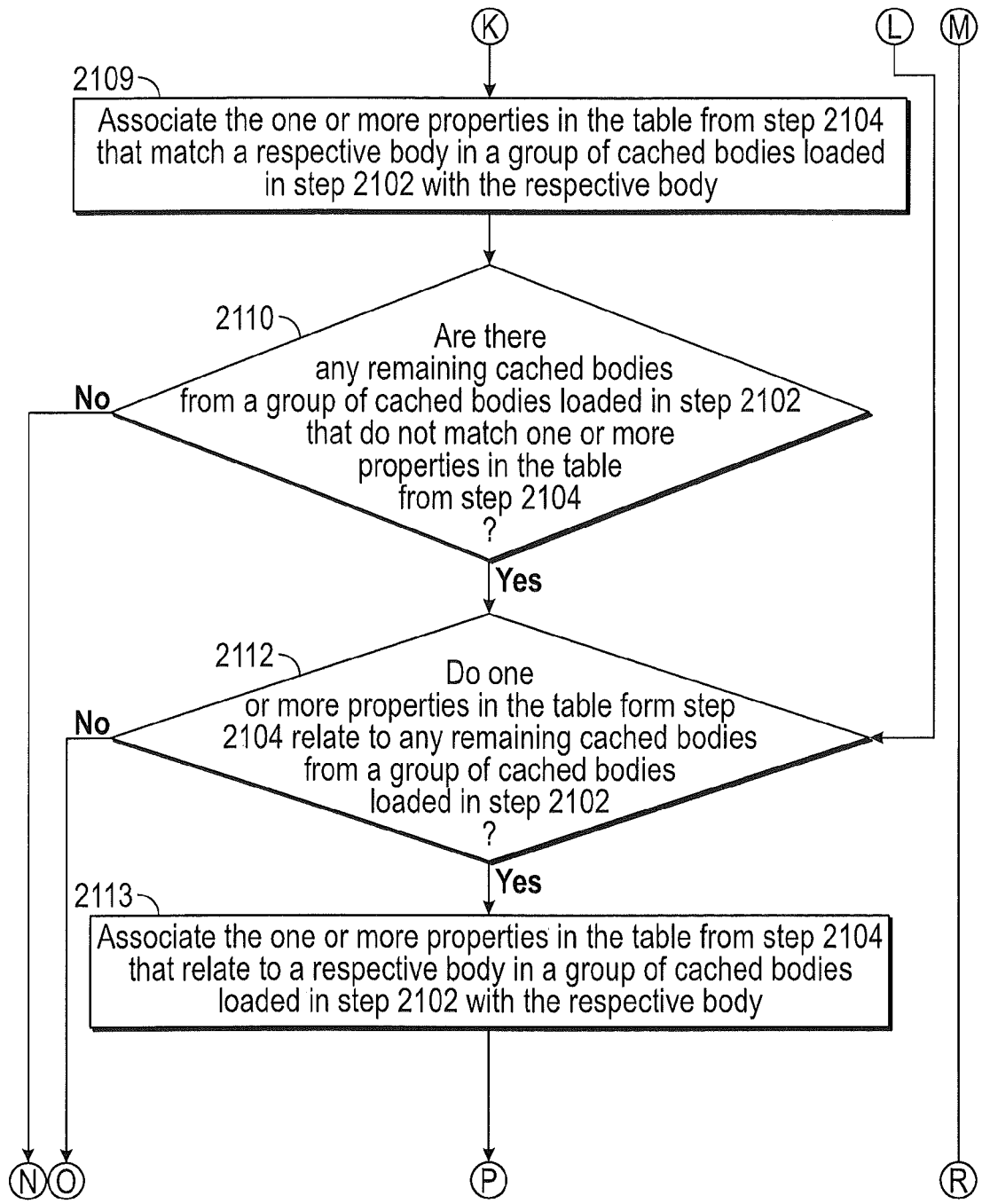
Figure 21C:
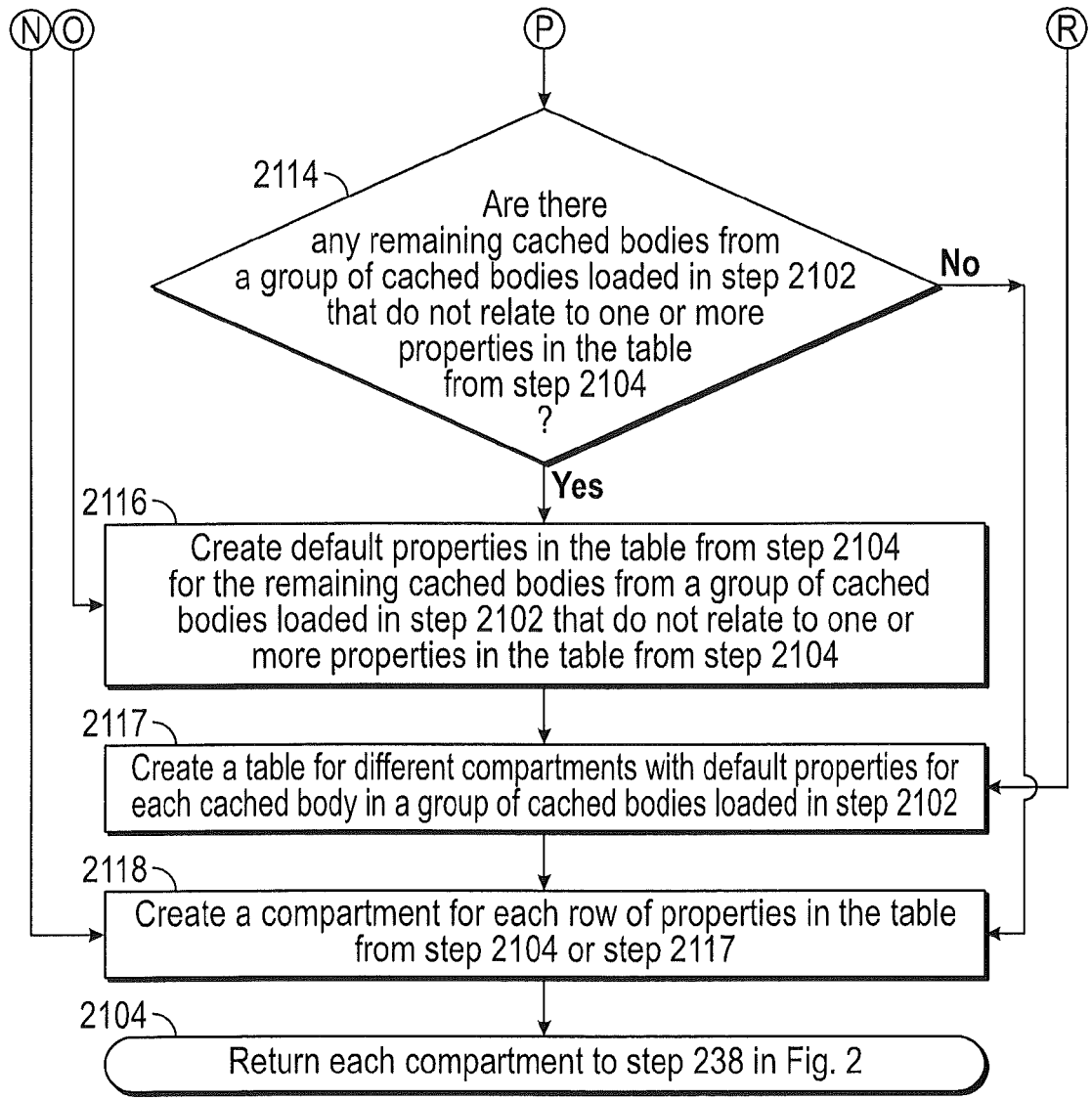

Referring now to FIGS. 21A-21C, a flow diagram of one embodiment of a method 2100 for implementing step 238 in FIG. 2 is illustrated. The method 2100 performs property matching on the group of cached bodies from step 214, step 218 and/or step 224 to convert each cached body to a respective compartment represented by a triangulated mesh of the bounding cached body with properties such as color and lithology. This facilitates finding specific compartments when a large number of compartments are present. One or more boundary objects such as surfaces, faults, fluid contacts and geoshells may be selected and all compartments that share those objects as boundaries are identified. Multiple selections mean that any of the selected boundaries may be matched. Since all compartments are a combination of patches from the framework structure, any compartment can be quickly scanned for common structural boundaries. This provides a near instant filtering method even with thousands of compartments in complex frameworks. In conventional applications, all compartments are generated with a random color and names that represent a string amalgamation of all the structural boundaries surrounding the compartment that can change each model build or new session load. The method 2100, however, provides the ability to set custom names and properties such as color or lithology, and provides that compartments return with the same properties each time the model is loaded to a new session.

In step 2102, the group of cached bodies from step 214, step 218 and/or step 224 is loaded.

In step 2103, the method 2100 determines if there is a table of properties for different compartments. If there is no table of properties for different compartments, then the method 2100 proceeds to step 2117. Otherwise, the method 2100 proceeds to step 2104.

In step 2104, a table of properties for different compartments is loaded. The table includes user specified properties like color, name or lithology and inherent properties like patches, center of mass and volume for each compartment. In FIG. 1, a graphical user interface 100 illustrates various different compartments (stratigraphic layer, fault block, fluid layer, combined), user specified properties and inherent properties in an exemplary table.

In step 2108, the method 2100 determines if one or more properties in the table from step 2104 match a cached body from a group of cached bodies loaded in step 2102. If one or more properties in the table from step 2104 do not match a cached body from a group of cached bodies loaded in step 2102, them the method 2100 proceeds to step 2112. Otherwise, the method 2100 proceeds to step 2109. A match is determined by comparing the inherent properties (e.g. patches, center of mass, volume) in the table and the inherent properties of each cached body from a group of cached bodies loaded in step 2102 for identical values (i.e. an exact match).

In step 2109, the one or more properties in the table from step 2104 that match (i.e. have identical inherent properties) a respective body in a group of cached bodies loaded in step 2102 are associated with the respective body.

In step 2110, the method 2100 determines if there are any remaining cached bodies from a group of cached bodies loaded in step 2102 that do not match one or more properties in the table from step 2104. If there are cached bodies from a group of cached bodies loaded in step 2102 that do not match one or more properties in the table from step 2104, then the method 2100 proceeds to step 2112. Otherwise, the method 2100 proceeds to step 2118. A match is determined by comparing the inherent properties (e.g. patches, center of mass, volume) in the table and the inherent properties of each cached body from a group of cached bodies loaded in step 2102 for identical values (i.e. an exact match).

In step 2112, the method 2100 determines if one or more properties in the table form step 2104 relate to any remaining cached bodies from a group of cached bodies loaded in step 2102. If one or more properties in the table form step 2104 do not relate to any remaining cached bodies from a group of cached bodies loaded in step 2102, then the method 2100 proceeds to step 2116. Otherwise, the method 2100 proceeds to step 2113. One or more properties in the table from step 2104 relate to a respective cached body from a group of cached bodies loaded in step 2102 if the inherent properties (e.g. patches, center of mass, volume) in the table and the inherent properties of a respective cached body have corresponding values within a predefined tolerance.

In step 2113, the one or more properties in the table from step 2104 that relate to a respective body in a group of cached bodies loaded in step 2102 are associated with the respective body.

In step 2114, the method 2100 determines if there are any remaining cached bodies from a group of cached bodies loaded in step 2102 that do not relate to one or more properties, in the table from step 2104. If there are cached bodies from a group of cached bodies loaded in step 2102 that do not relate to one or more properties in the table from step 2104, then the method proceeds to step 2116. Otherwise, the method 2100 proceeds to step 2118.

In step 2116, default properties are created in the table from step 2104 for the remaining cached bodies from a group of cached bodies loaded in step 2102 that do not relate to one or more properties in the table from step 2104. The method 2100 then proceeds to step 2118.

In step 2117, a table is created for different compartments with default properties for each cached body in a group of cached bodies loaded in step 2102. The default properties include user specified properties like color, name or lithology and inherent properties like patches, center of mass and volume for each compartment.

In step 2118, a compartment is created for each row of properties in the table from step 2104 or step 2117, wherein each row of properties represents one or more continuous bodies. Each compartment is returned to step 238 in FIG. 2.

Custom Reservoir Generation

Figure 23A:
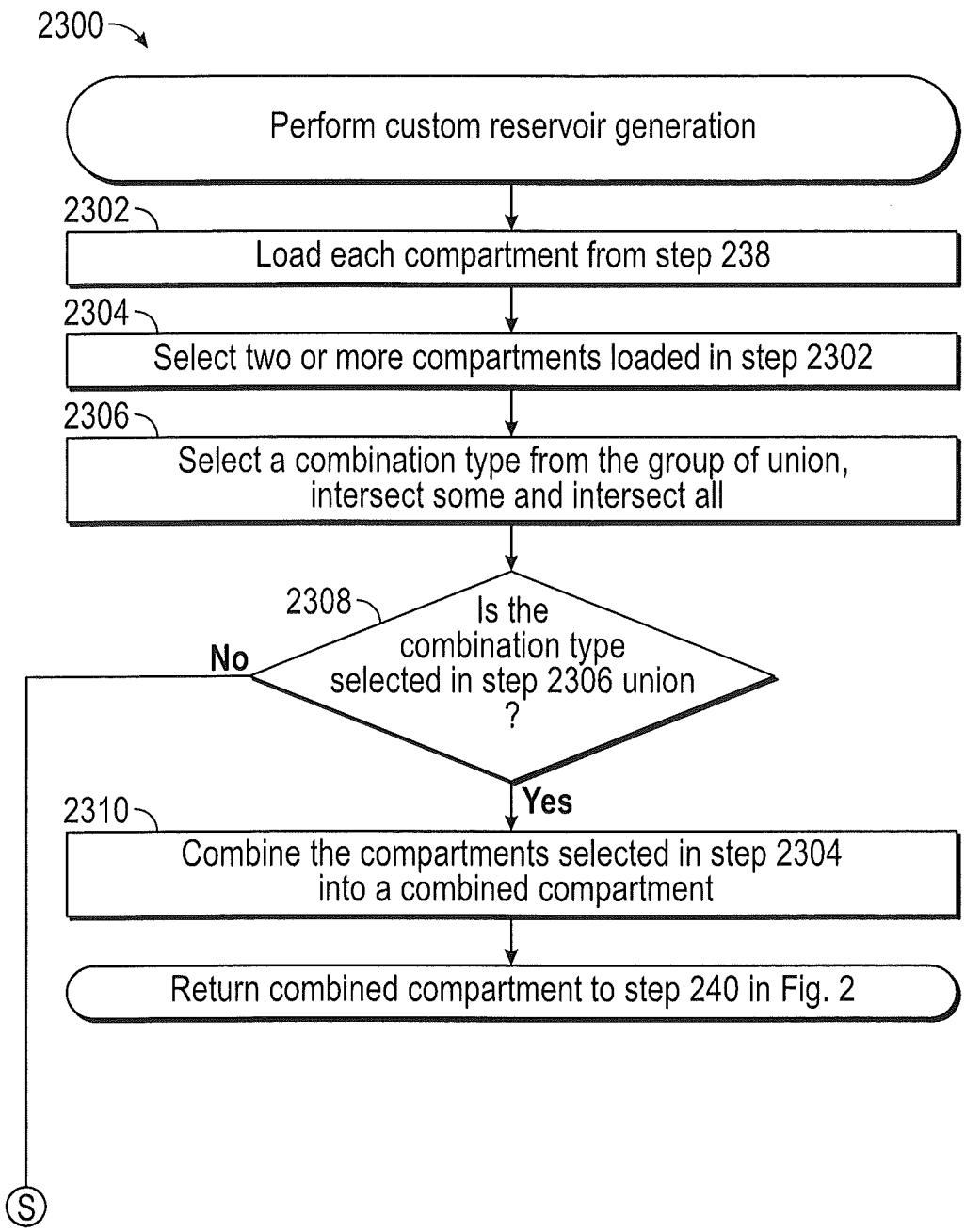
FIGS. 23A-23B are a flow diagram illustrating one embodiment of a method 2300 for implementing step 240 in FIG. 2.
Figure 23B:
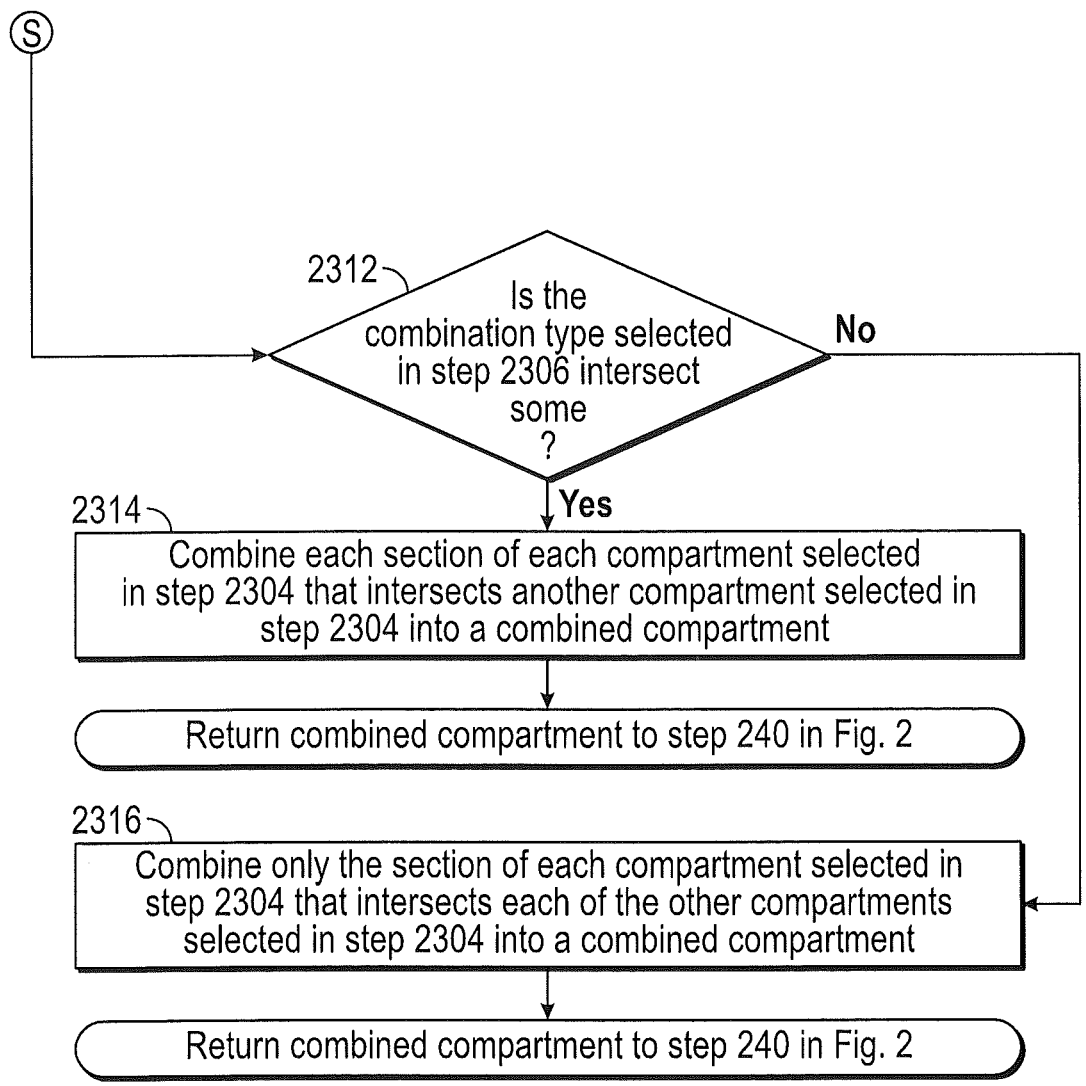

Referring now to FIGS. 23A-23B, a flow diagram of one embodiment of a method 2300 for implementing step 240 in FIG. 2 is illustrated. The method 2300 performs custom reservoir generation on each compartment from step 238 to generate one or more combined compartments. Since each compartment is composed of patches, those patches can be reassembled into new compartments on the fly. By analyzing the interior of bounding patches, connected compartments may be either grouped or isolated. Once a new set of sealed patches is assembled, the interior seams will be removed. The final result is a merge or intersection between any set of compartments, which forms a combined compartment. All volumes and properties will honor the new bounding edges. In conventional applications, all compartments are isolated as individual bodies that are manually assembled into meaningful geological units. The method 2300, however, automatically generates most standard geological units. This automatic generation provides an advantage, even in those situations where a subset or merging of these units may be more useful.

In step 2302, each compartment from step 238 is loaded.

In step 2304, two or more compartments loaded in step 2302 are selected.

Figure 22:
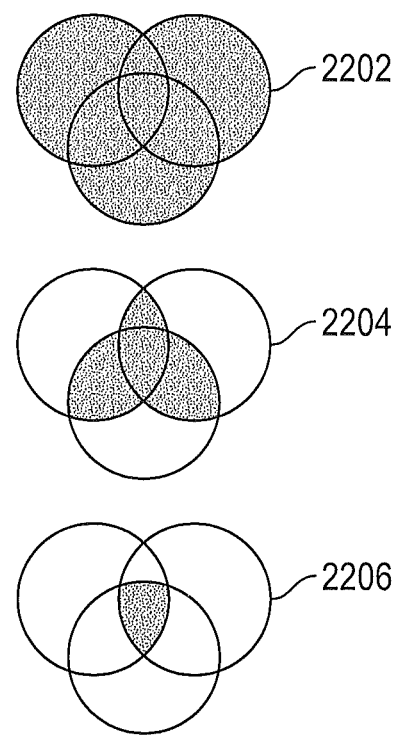
FIG. 22 is a Venn Diagram illustrating the various combinations from the group of union, intersect some and intersect all.

In step 2306, a combination type from the group of union, intersect some, intersect all is selected. A union is the combination of all selected compartments. Intersect some is the combination of the section of each selected compartment that intersects another selected compartment. Intersect all is the combination of only the section of each selected compartment that intersects each of the other selected compartments. In FIG. 22, a Venn Diagram illustrates the various combinations from the group of union (2202), intersect some (2204) and intersect all (2206).

In step 2308, the method 2300 determines if the combination type selected in step 2306 is union using the client interface and/or the video interface described in reference to FIG. 25. If the combination type selected in step 2306 is not a union, then the method 2300 proceeds to step 2312. Otherwise, the method 2300 proceeds to step 2310.

In step 2310, the compartments selected in step 2304 are combined into a combined compartment that is returned to step 240 in FIG. 2.

In step 2312, the method 2300 determines if the combination type selected in step 2306 is intersect some using the client interface and/or the video interface described in reference to FIG. 25. If the combination type selected in step 2306 is not intersect some, then the method 2300 proceeds to step 2316. Otherwise, the method 2300 proceeds to step 2314.

In step 2314, each section of each compartment selected in step 2304 that intersects another compartment selected in step 2304 is combined into a combined compartment that is returned to step 240 in FIG. 2. Unlike the example in FIG. 22, multiple intersections may be non-contiguous depending on the position of the selected compartments.

In step 2316, only the section of each compartment selected in step 2304 that intersects each of the other compartments selected in step 2304 is combined into a combined compartment that is returned to step 240 in FIG. 2.

Dynamic Interactions

Figure 24:
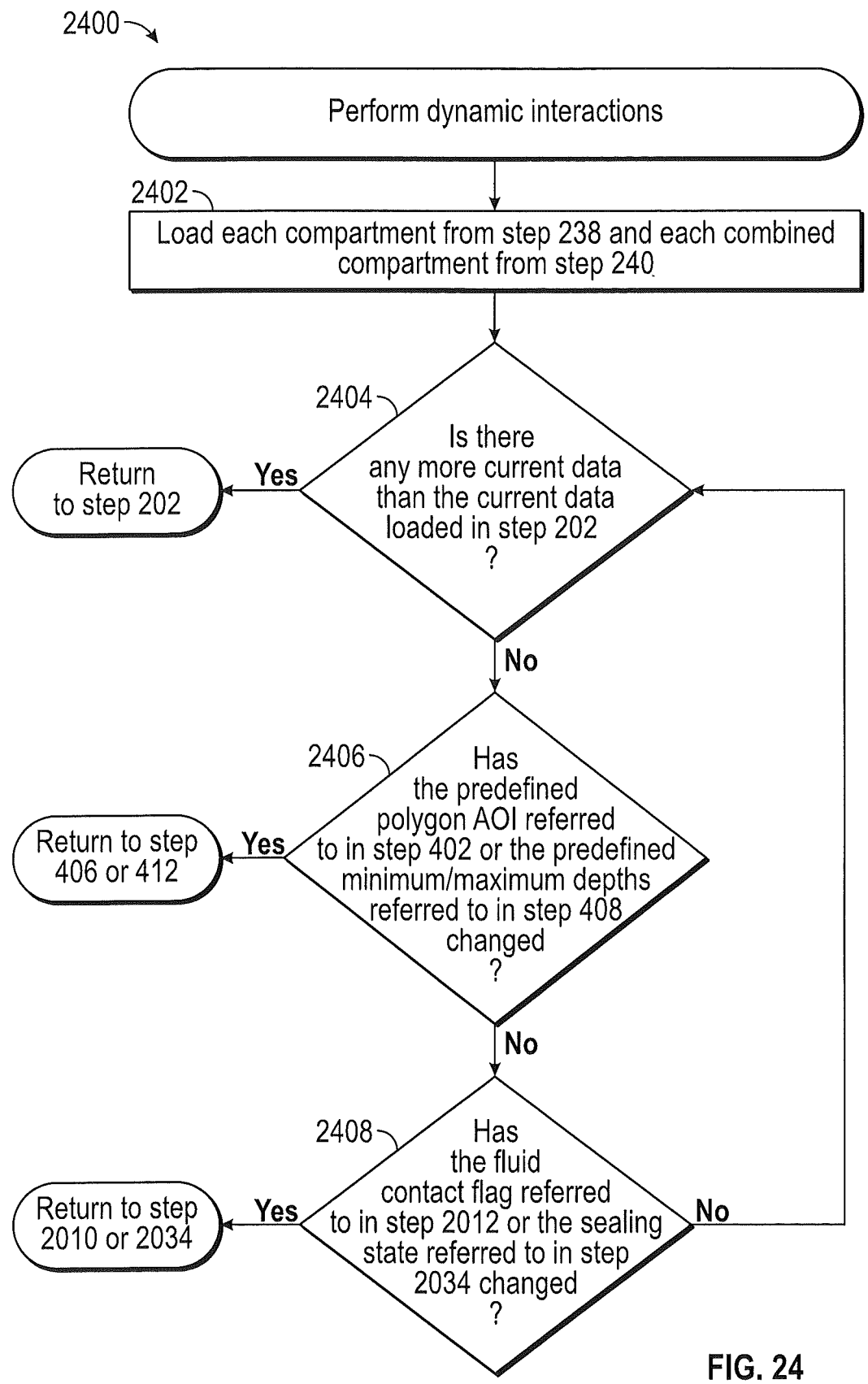
FIG. 24 is a flow diagram illustrating one embodiment of a method 2400 for implementing step 244 in FIG. 2.

Referring now to FIG. 24, a flow diagram of one embodiment of a method 2400 for implementing step 244 in FIG. 2 is illustrated. The method 2400 performs one or more dynamic interactions on the current data loaded in step 202, the predefined polygon AOI and the predefined minimum/maximum depths from the VOI based model sealing performed in step 208 and/or the fluid contact flag and the sealing state from the fluid fill analysis performed in step 224 to dynamically update the compartments from step 238 and/or the combined compartments from step 240. Compartments are automatically synchronized with updates and there is no need to redetect compartments after framework changes. Since the compartments can now incrementally update, performance is improved. Even disabling compartments will keep the state preserved so enabling compartments will still only need an incremental update. As a result, compartments may be active more frequently and more analysis tools may be used. In conventional applications, compartments are often required to be manually redetected any time they updated the model, changed properties, or grouped compartments. In addition, visibility states are often required to be constantly toggled to parse names and figure out which compartment is needed. The method 2400, however, enables all aspects of dynamic updatability for compartments. In other words, sealed geological units are always visible that update with each change to the model. There is no additional interaction required and the compartments can be used for quality control and better comprehend the complex, three-dimensional structure of a geological model.

In step 2402, each compartment from step 238 and each combined compartment from step 240 is loaded.

In step 2404, the method 2400 determines if the there is any more current data than the current data loaded in step 202. If the there is more current data than the current data loaded in step 202, then the method 2400 returns to step 202 to load the more current data. Otherwise, the method 2400 proceeds to step 2406.

In step 2406, the method 2400 determines if the predefined polygon AOI referred to in step 402 or the predefined minimum/maximum depths referred to in step 408 have changed. If the predefined polygon AOI referred to in step 402 or the predefined minimum/maximum depths referred to in step 408 have changed, then the method 2400 returns to step 406 to set the polygon AOI using a new predefined polygon AOI or step 412 to set the minimum/maximum depths using new predefined minimum/maximum depths. Otherwise, the method 2400 proceeds to step 2408.

In step 2408, the method 2400 determines if the fluid contact flag referred to in step 2012 or the sealing state referred to in step 2034 have changed. If the fluid contact flag referred to in step 2012 or the sealing state referred to in step 2034 have changed, then the method 2400 returns to step 2010 to select a fluid contact flag using a new fluid contact flag or step 2034 to determine if there is a shared patch using a new sealing state. Otherwise, the method 2400 returns to step 2404.

System Description

The present disclosure may be implemented through a computer-executable program of instructions, such as program modules, generally referred to as software applications or application programs executed by a computer. The software may include, for example, routines, programs, objects, components, data structures, etc., that perform particular tasks or implement particular abstract data types. The software forms an interface to allow a computer to react according to a source of input. DecisionSpace® Geosciences, which is a commercial software application marketed by Landmark Graphics Corporation, may be used as an interface application to implement the present disclosure. The software may also cooperate with other code segments to initiate a variety of tasks in response to data received in conjunction with the source of the received data. Other code segments may provide optimization components including, but not limited to, neural networks, earth modeling, history-matching, optimization, visualization, data management, reservoir simulation and economics. The software may be stored and/or carried on any variety of memory such as CD-ROM, magnetic disk, bubble memory and semiconductor memory (e.g., various types of RAM or ROM). Furthermore, the software and its results may be transmitted over a variety of carrier media such as optical fiber, metallic wire, and/or through any of a variety of networks, such as the Internet.

Moreover, those skilled in the art will appreciate that the disclosure may be practiced with a variety of computer-system configurations, including hand-held devices, multiprocessor systems, microprocessor-based or programmable-consumer electronics, minicomputers, mainframe computers, and the like. Any number of computer-systems and computer networks are acceptable for use with the present disclosure. The disclosure may be practiced in distributed-computing environments where tasks are performed by remote-processing devices that are linked through a communications network. In a distributed-computing environment, program modules may be located in both local and remote computer-storage media including memory storage devices. The present disclosure may therefore, be implemented in connection with various hardware, software or a combination thereof, in a computer system or other processing system.

Referring now to FIG. 25, a block diagram illustrates one embodiment of a system for implementing the present disclosure on a computer. The system includes a computing unit, sometimes referred to as a computing system, which contains memory, application programs, a client interface, a video interface, and a processing unit. The computing unit is only one example of a suitable computing environment and is not intended to suggest any limitation as to the scope of use or functionality of the disclosure.

The memory primarily stores the application programs, which may also be described as program modules containing computer-executable instructions, executed by the computing unit for implementing the present disclosure described herein and illustrated in FIGS. 1-24. The memory therefore, includes a compartment geogrouping module, which enables steps 204, 206, 210-240 and 244 in FIG. 2. The component geogrouping module may integrate functionality from the remaining application programs illustrated in FIG. 25. In particular, DecisionSpace® Geosciences may be used as an interface application to perform step 242 in FIG. 2 and a 3D modeling engine may be used to perform step 208 in FIG. 2. Step 202 in FIG. 2 may be performed using the 3D modeling engine and a database. Although DecisionSpace® Geosciences may be used as an interface application, other interface applications may be used, instead, or the compartment geogrouping module may be used as a stand-alone application.

Although the computing unit is shown as having a generalized memory, the computing unit typically includes a variety of computer readable media. By way of example, and not limitation, computer readable media may comprise computer storage media and communication media. The computing system memory may include computer storage media in the form of volatile and/or nonvolatile memory such as a read only memory (ROM) and random access memory (RAM). A basic input/output system (BIOS), containing the basic routines that help to transfer information between elements within the computing unit, such as during start-up, is typically stored in ROM. The RAM typically contains data and/or program modules that are immediately accessible to and/or presently being operated on by the processing unit. By way of example, and not limitation, the computing unit includes an operating system, application programs, other program modules, and program data.

The components shown in the memory may also be included in other removable/non-removable, volatile/nonvolatile computer storage media or they may be implemented in the computing unit through an application program interface ("API") or cloud computing, which may reside on a separate computing unit connected through a computer system or network. For example only, a hard disk drive may read from or write to non-removable, nonvolatile magnetic media, a magnetic disk drive may read from or write to a removable, nonvolatile magnetic disk, and an optical disk drive may read from or write to a removable, nonvolatile optical disk such as a CD ROM or other optical media. Other removable/non-removable, volatile/nonvolatile computer storage media that can be used in the exemplary operating environment may include, but are not limited to, magnetic tape cassettes, flash memory cards, digital versatile disks, digital video tape, solid state RAM, solid state ROM, and the like. The drives and their associated computer storage media discussed above provide storage of computer readable instructions, data structures, program modules and other data for the computing unit.

A client may enter commands and information into the computing unit through the client interface, which may be input devices such as a keyboard and pointing device, commonly referred to as a mouse, trackball or touch pad. Input devices may include a microphone, joystick, satellite dish, scanner, voice recognition or gesture recognition, or the like. These and other input devices are often connected to the processing unit through the client interface that is coupled to a system bus, but may be connected by other interface and bus structures, such as a parallel port or a universal serial bus (USB).

A monitor or other type of display device may be connected to the system bus via an interface, such as a video interface. A graphical user interface ("GUI") may also be used with the video interface to receive instructions from the client interface and transmit instructions to the processing unit. In addition to the monitor, computers may also include other peripheral output devices such as speakers and printer, which may be connected through an output peripheral interface.

Although many other internal components of the computing unit are not shown, those of ordinary skill in the art will appreciate that such components and their interconnection are well known.

While the present disclosure has been described in connection with presently preferred embodiments, it will be understood by those skilled in the art that it is not intended to limit the disclosure to those embodiments. It is therefore, contemplated that various alternative embodiments and modifications may be made to the disclosed embodiments without departing from the spirit and scope of the disclosure defined by the appended claims and equivalents thereof.

The invention claimed is:

1. A method for dynamically updating compartments representing one or more geological structures, which comprises:

loading current data;

extrapolating the current data against a volume of interest to produce one or more bodies;

extracting at least one of a stratigraphic layer and a fault block from the one or more bodies to produce at least one group of bodies with at least one of the stratigraphic layer and the fault block;

extracting a fluid reservoir from each group of bodies to produce a group of fluid reservoir bodies;

converting each body in at least one of the at least one group of bodies to a respective compartment;

generating one or more combined compartments representing a custom reservoir using each compartment; and automatically updating at least one of each compartment and each combined compartment using a computer processor.

2. The method of claim 1, wherein at least one of each compartment and each combined compartment is updated using more current data.

3. The method of claim 1, wherein the current data is extrapolated against the volume of interest using a predefined polygon area-of-interest and predefined minimum/maximum depths of at least one of surfaces and faults.

4. The method of claim 3, wherein the at least one of each compartment and each combined compartment is updated using at least one of a new predefined polygon area-of-interest and new predefined minimum/maximum depths.

5. The method of claim 1, wherein the fluid reservoir is extracted from each group of bodies using a fluid contact flag and a sealing state.

6. The method of claim 5, wherein the at least one of each compartment and each combined compartment is updated using at least one of a new fluid contact flag and a new sealing state.

7. The method of claim 1, wherein the at least one of each compartment and each combined compartment is automatically updated without any user interaction.

8. A non-transitory program carrier device tangibly carrying computer-executable instructions for dynamically updating compartments representing one or more geological structures, the instructions being executable to implement:

loading current data;

extrapolating the current data against a volume of interest to produce one or more bodies;

extracting at least one of a stratigraphic layer and a fault block from the one or more bodies to produce at least one group of bodies with at least one of the stratigraphic layer and the fault block;

extracting a fluid reservoir from each group of bodies to produce a group of fluid reservoir bodies;

converting each body in at least one of the at least one group of bodies to a respective compartment;

generating one or more combined compartments representing a custom reservoir using each compartment; and automatically updating at least one of each compartment and each combined compartment.

9. The program carrier device of claim 8, wherein at least one of each compartment and each combined compartment is updated using more current data.

10. The program carrier device of claim 8, wherein the current data is extrapolated against the volume of interest using a predefined polygon area-of-interest and predefined minimum/maximum depths of at least one of surfaces and faults.

11. The program carrier device of claim 10, wherein the at least one of each compartment and each combined compartment is updated using at least one of a new predefined polygon area-of-interest and new predefined minimum/maximum depths.

12. The program carrier device of claim 8, wherein the fluid reservoir is extracted from each group of bodies using a fluid contact flag and a sealing state.

13. The program carrier device of claim 12, wherein the at least one of each compartment and each combined compartment is updated using at least one of a new fluid contact flag and a new sealing state.

14. The method of claim 8, wherein the at least one of each compartment and each combined compartment is automatically updated without any user interaction.

15. A non-transitory program carrier device tangibly carrying computer-executable instructions for dynamically updating compartments representing one or more geological structures, the instructions being executable to implement:

loading current data;

extrapolating the current data against a volume of interest to produce one or more bodies;

extracting at least one of a stratigraphic layer and a fault block from the one or more bodies to produce at least one group of bodies with at least one of the stratigraphic layer and the fault block;

extracting a fluid reservoir from each group of bodies to produce a group of fluid reservoir bodies;

converting each body in at least one of the at least one group of bodies to a respective compartment;

generating one or more combined compartments using each compartment; and automatically updating at least one of each compartment and each combined compartment without any user interaction.

16. The program carrier device of claim 15, wherein at least one of each compartment and each combined compartment is updated using more current data.

17. The program carrier device of claim 15, wherein the current data is extrapolated against the volume of interest using a predefined polygon area-of-interest and predefined minimum/maximum depths of at least one of surfaces and faults.

18. The program carrier device of claim 17, wherein the at least one of each compartment and each combined compartment is updated using at least one of a new predefined polygon area-of-interest and new predefined minimum/maximum depths.

19. The program carrier device of claim 15, wherein the fluid reservoir is extracted from each group of bodies using a fluid contact flag and a sealing state.

20. The program carrier device of claim 19, wherein the at least one of each compartment and each combined compartment is updated using at least one of a new fluid contact flag and a new sealing state.

* * * * *